United States Patent
Rubenstein (10) Patent No.: US 9,606,586 B2
(45) Date of Patent: Mar. 28, 2017

(54) HEAT TRANSFER DEVICE

(75) Inventor: Brandon A. Rubenstein, Lynnwood, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 164 days.

(21) Appl. No.: 13/355,914

(22) Filed: Jan. 23, 2012

(65) Prior Publication Data

US 2013/0186598 A1    Jul. 25, 2013

(51) Int. Cl.
*F28D 15/02* (2006.01)
*G06F 1/20* (2006.01)
*H01L 23/427* (2006.01)
*H01L 23/467* (2006.01)
*F28D 15/00* (2006.01)

(52) U.S. Cl.
CPC .............. *G06F 1/20* (2013.01); *H01L 23/427* (2013.01); *H01L 23/467* (2013.01); *G06F 2200/201* (2013.01); *H01L 2924/0002* (2013.01)

(58) Field of Classification Search
CPC . G06F 1/20; G06F 1/201; G06F 1/203; G06F 1/206; F28D 15/02
USPC ................. 361/679.46, 0.47, 0.52, 697, 700; 165/104.17, 0.18, 0.21, 0.22, 0.28, 0.33
See application file for complete search history.

(56) References Cited

U.S. PATENT DOCUMENTS

| | | |
|---|---|---|
| 3,971,065 A | 7/1976 | Bayer |
| 4,711,512 A | 12/1987 | Upatnieks |
| 4,860,361 A | 8/1989 | Sato et al. |
| 5,019,808 A | 5/1991 | Prince et al. |
| 5,146,355 A | 9/1992 | Prince et al. |
| 5,309,169 A | 5/1994 | Leppert |
| 5,359,444 A | 10/1994 | Piosenka et al. |
| 5,455,458 A | 10/1995 | Quon et al. |
| 5,459,611 A | 10/1995 | Bohn et al. |
| 5,483,307 A | 1/1996 | Anderson |
| 5,543,588 A | 8/1996 | Bisset et al. |
| 5,574,473 A | 11/1996 | Sekiguchi |
| 5,579,830 A | 12/1996 | Giammaruti |

(Continued)

FOREIGN PATENT DOCUMENTS

| | | |
|---|---|---|
| CN | 1440513 | 9/2003 |
| CN | 1469700 | 1/2004 |

(Continued)

OTHER PUBLICATIONS

"International Search Report and Written Opinion", Application No. PCT/US2013/053676, Oct. 16, 2013, 10 pages.

(Continued)

*Primary Examiner* — Tuan T Dinh
*Assistant Examiner* — Mukund G Patel (57) ABSTRACT

A heat transfer device is described. In one or more implementations, a device includes a housing that is moveable through a plurality of orientations involving at least two dimensions during usage, a heat-generating device disposed within the housing, and a heat transfer device disposed within the housing. The heat transfer device has a plurality of heat pipes configured to transfer heat using thermal conductivity and phase transition from the heat-generating device, the plurality of heat pipes arranged to provide generally uniform heat transfer from the heat-generating device during movement of the housing through the plurality of orientations.

20 Claims, 5 Drawing Sheets

(56) References Cited

U.S. PATENT DOCUMENTS

| | | | |
|---|---|---|---|
| 5,583,609 A | 12/1996 | Mizutani et al. | |
| 5,606,455 A | 2/1997 | Eichenlaub | |
| 5,614,941 A | 3/1997 | Hines | |
| 5,651,414 A | 7/1997 | Suzuki et al. | |
| 5,673,146 A | 9/1997 | Kelly | |
| 5,708,449 A | 1/1998 | Heacock et al. | |
| 5,714,967 A | 2/1998 | Okamura et al. | |
| 5,737,171 A | 4/1998 | Buller et al. | |
| 5,751,476 A | 5/1998 | Matsui et al. | |
| 5,856,842 A | 1/1999 | Tedesco | |
| 5,940,149 A | 8/1999 | Vanderwerf | |
| 5,982,553 A | 11/1999 | Bloom et al. | |
| 6,082,623 A | 7/2000 | Chang | |
| 6,160,667 A | 12/2000 | Smoot | |
| 6,226,178 B1 | 5/2001 | Broder et al. | |
| 6,239,502 B1 | 5/2001 | Grewe et al. | |
| 6,271,808 B1 | 8/2001 | Corbin | |
| 6,307,142 B1 | 10/2001 | Allen et al. | |
| 6,323,970 B1 | 11/2001 | Popovich | |
| 6,377,401 B1 | 4/2002 | Bartlett | |
| 6,411,512 B1 | 6/2002 | Mankaruse et al. | |
| 6,446,442 B1 | 9/2002 | Batchelor et al. | |
| 6,466,198 B1 | 10/2002 | Feinstein | |
| 6,470,289 B1 | 10/2002 | Peters et al. | |
| 6,481,851 B1 | 11/2002 | McNelley et al. | |
| 6,529,331 B2 | 3/2003 | Massof et al. | |
| 6,542,307 B2 | 4/2003 | Gleckman et al. | |
| 6,554,428 B2 | 4/2003 | Fergason et al. | |
| 6,577,411 B1 | 6/2003 | David | |
| 6,580,529 B1 | 6/2003 | Amitai et al. | |
| 6,621,702 B2 | 9/2003 | Elias et al. | |
| 6,631,755 B1 | 10/2003 | Kung et al. | |
| 6,635,999 B2 | 10/2003 | Belliveau | |
| 6,639,201 B2 | 10/2003 | Almogy et al. | |
| 6,702,003 B2 * | 3/2004 | Hsiao | F28D 15/02 165/104.21 |
| 6,712,129 B1 | 3/2004 | Lee | |
| 6,735,499 B2 | 5/2004 | Ohki et al. | |
| 6,753,828 B2 | 6/2004 | Tuceryan et al. | |
| 6,775,460 B2 | 8/2004 | Steiner et al. | |
| 6,804,115 B2 * | 10/2004 | Lai | 361/695 |
| 6,809,925 B2 | 10/2004 | Belady et al. | |
| 6,825,987 B2 | 11/2004 | Repetto et al. | |
| 6,829,095 B2 | 12/2004 | Amitai | |
| 6,867,753 B2 | 3/2005 | Chinthammit et al. | |
| 6,889,755 B2 | 5/2005 | Zuo et al. | |
| 6,906,901 B1 | 6/2005 | Liu | |
| 6,919,867 B2 | 7/2005 | Sauer | |
| 6,947,020 B2 | 9/2005 | Kiser et al. | |
| 6,964,731 B1 | 11/2005 | Krisko et al. | |
| 6,971,443 B2 | 12/2005 | Kung et al. | |
| 6,992,738 B2 | 1/2006 | Ishihara et al. | |
| 6,997,241 B2 | 2/2006 | Chou et al. | |
| 7,015,876 B1 | 3/2006 | Miller | |
| 7,048,385 B2 | 5/2006 | Beeson et al. | |
| 7,069,975 B1 | 7/2006 | Haws et al. | |
| 7,098,617 B1 | 8/2006 | Oljaca et al. | |
| 7,113,605 B2 | 9/2006 | Rui et al. | |
| 7,116,555 B2 | 10/2006 | Kamath et al. | |
| 7,138,781 B2 | 11/2006 | Murray et al. | |
| 7,184,615 B2 | 2/2007 | Levola | |
| 7,191,820 B2 | 3/2007 | Chou et al. | |
| 7,193,584 B2 | 3/2007 | Lee | |
| 7,250,930 B2 | 7/2007 | Hoffman et al. | |
| 7,261,453 B2 | 8/2007 | Morejon et al. | |
| 7,271,795 B2 | 9/2007 | Bradski | |
| 7,277,282 B2 | 10/2007 | Tate | |
| 7,337,018 B2 | 2/2008 | Espinoza-Ibarra et al. | |
| 7,359,420 B2 | 4/2008 | Shchegrov et al. | |
| 7,365,734 B2 | 4/2008 | Fateh et al. | |
| 7,369,101 B2 | 5/2008 | Sauer et al. | |
| 7,376,852 B2 | 5/2008 | Edwards | |
| 7,396,133 B2 | 7/2008 | Burnett et al. | |
| 7,412,306 B2 | 8/2008 | Katoh et al. | |
| 7,416,017 B2 | 8/2008 | Haws et al. | |
| 7,417,617 B2 | 8/2008 | Eichenlaub | |
| 7,428,001 B2 | 9/2008 | Schowengerdt et al. | |
| 7,430,349 B2 | 9/2008 | Jones | |
| 7,430,355 B2 | 9/2008 | Heikenfeld et al. | |
| 7,455,102 B2 | 11/2008 | Cheng | |
| 7,505,269 B1 | 3/2009 | Cosley et al. | |
| 7,515,143 B2 | 4/2009 | Keam et al. | |
| 7,542,665 B2 | 6/2009 | Lei | |
| 7,551,814 B1 | 6/2009 | Smits | |
| 7,576,916 B2 | 8/2009 | Amitai | |
| 7,607,111 B2 | 10/2009 | Vaananen et al. | |
| 7,619,895 B1 * | 11/2009 | Wertz et al. | 361/719 |
| 7,631,687 B2 | 12/2009 | Yang | |
| 7,646,606 B2 | 1/2010 | Rytka et al. | |
| 7,660,500 B2 | 2/2010 | Konttinen et al. | |
| 7,693,292 B1 | 4/2010 | Gross et al. | |
| 7,701,716 B2 * | 4/2010 | Blanco et al. | 361/699 |
| 7,756,402 B2 | 7/2010 | Zou et al. | |
| 7,768,534 B2 | 8/2010 | Pentenrieder et al. | |
| 7,777,944 B2 | 8/2010 | Ho et al. | |
| 7,817,104 B2 | 10/2010 | Ryu et al. | |
| 7,843,691 B2 | 11/2010 | Reichert et al. | |
| 7,894,613 B1 | 2/2011 | Ong et al. | |
| 7,903,409 B2 | 3/2011 | Patel et al. | |
| 7,909,958 B2 | 3/2011 | Washburn et al. | |
| 7,941,231 B1 | 5/2011 | Dunn | |
| 7,986,462 B2 | 7/2011 | Kobayashi et al. | |
| 8,033,709 B2 | 10/2011 | Kao et al. | |
| 8,046,616 B2 | 10/2011 | Edwards | |
| 8,061,411 B2 | 11/2011 | Xu et al. | |
| 8,085,948 B2 | 12/2011 | Thomas et al. | |
| 8,125,579 B2 | 2/2012 | Khan et al. | |
| 8,160,411 B2 | 4/2012 | Levola et al. | |
| 8,195,220 B2 | 6/2012 | Kim et al. | |
| 8,233,204 B1 | 7/2012 | Robbins et al. | |
| 8,233,273 B2 | 7/2012 | Chen et al. | |
| 8,274,614 B2 | 9/2012 | Yokote et al. | |
| 8,384,999 B1 | 2/2013 | Crosby et al. | |
| 8,392,035 B2 | 3/2013 | Patel et al. | |
| 8,395,898 B1 | 3/2013 | Chamseddine et al. | |
| 8,418,083 B1 | 4/2013 | Lundy et al. | |
| 8,446,340 B2 | 5/2013 | Aharoni | |
| 8,482,920 B2 | 7/2013 | Tissot et al. | |
| 8,513,908 B2 | 8/2013 | Huang et al. | |
| 8,611,014 B2 | 12/2013 | Valera et al. | |
| 8,638,498 B2 | 1/2014 | Bohn et al. | |
| 8,645,871 B2 | 2/2014 | Fong et al. | |
| 8,666,212 B1 | 3/2014 | Amirparviz | |
| 8,712,598 B2 | 4/2014 | Dighde et al. | |
| 8,754,831 B2 | 6/2014 | Kollin et al. | |
| 8,810,600 B2 | 8/2014 | Bohn et al. | |
| 8,817,350 B1 | 8/2014 | Robbins et al. | |
| 8,823,531 B1 | 9/2014 | McCleary et al. | |
| 8,909,384 B1 | 12/2014 | Beitelmal et al. | |
| 8,917,453 B2 | 12/2014 | Bohn | |
| 8,934,235 B2 | 1/2015 | Rubenstein et al. | |
| 8,941,683 B2 | 1/2015 | Son et al. | |
| 8,989,535 B2 | 3/2015 | Robbins | |
| 9,212,664 B2 | 12/2015 | Tsai et al. | |
| 9,298,012 B2 | 3/2016 | Bohn et al. | |
| 9,311,909 B2 | 4/2016 | Giaimo et al. | |
| 2001/0043208 A1 | 11/2001 | Furness, III et al. | |
| 2002/0044152 A1 | 4/2002 | Abbott et al. | |
| 2002/0044162 A1 | 4/2002 | Sawatari | |
| 2002/0063820 A1 | 5/2002 | Broer et al. | |
| 2002/0097558 A1 | 7/2002 | Stone et al. | |
| 2003/0000689 A1 * | 1/2003 | Kuo et al. | 165/185 |
| 2003/0006364 A1 | 1/2003 | Katzir et al. | |
| 2003/0023889 A1 | 1/2003 | Hofstee et al. | |
| 2004/0011503 A1 * | 1/2004 | Kung et al. | 165/46 |
| 2004/0085649 A1 | 5/2004 | Repetto et al. | |
| 2004/0135209 A1 | 7/2004 | Hsieh et al. | |
| 2004/0267990 A1 | 12/2004 | Lin | |
| 2005/0174737 A1 | 8/2005 | Meir | |
| 2005/0207120 A1 | 9/2005 | Tseng et al. | |
| 2005/0243107 A1 | 11/2005 | Haim et al. | |
| 2005/0285878 A1 | 12/2005 | Singh et al. | |
| 2006/0018025 A1 | 1/2006 | Sharon et al. | |
| 2006/0032616 A1 | 2/2006 | Yang | |

(56) References Cited

U.S. PATENT DOCUMENTS

| | | |
|---|---|---|
| 2006/0054787 A1 | 3/2006 | Olsen et al. |
| 2006/0072206 A1 | 4/2006 | Tsuyuki et al. |
| 2006/0118280 A1* | 6/2006 | Liu .................. 165/104.33 |
| 2006/0129951 A1 | 6/2006 | Vaananen et al. |
| 2006/0132914 A1 | 6/2006 | Weiss et al. |
| 2006/0164382 A1 | 7/2006 | Kulas et al. |
| 2006/0196643 A1 | 9/2006 | Hata et al. |
| 2006/0249765 A1 | 11/2006 | Hsieh |
| 2007/0008456 A1 | 1/2007 | Lesage et al. |
| 2007/0027591 A1 | 2/2007 | Goldenberg et al. |
| 2007/0041684 A1 | 2/2007 | Popovich |
| 2007/0097019 A1 | 5/2007 | Wynne-Powell et al. |
| 2007/0100494 A1 | 5/2007 | Patel et al. |
| 2007/0147673 A1 | 6/2007 | Crandall |
| 2007/0153395 A1 | 7/2007 | Repetto et al. |
| 2007/0177260 A1 | 8/2007 | Kuppenheimer et al. |
| 2007/0236959 A1 | 10/2007 | Tolbert |
| 2007/0284093 A1* | 12/2007 | Bhatti et al. ........... 165/104.33 |
| 2008/0043100 A1 | 2/2008 | Sobel et al. |
| 2008/0043425 A1 | 2/2008 | Hebert et al. |
| 2008/0088603 A1 | 4/2008 | Eliasson et al. |
| 2008/0088624 A1 | 4/2008 | Long et al. |
| 2008/0106677 A1 | 5/2008 | Kuan et al. |
| 2008/0117341 A1 | 5/2008 | McGrew |
| 2008/0141681 A1 | 6/2008 | Arnold |
| 2008/0150913 A1 | 6/2008 | Bell et al. |
| 2008/0174735 A1 | 7/2008 | Quach et al. |
| 2008/0248852 A1 | 10/2008 | Rasmussen |
| 2008/0303918 A1 | 12/2008 | Keithley |
| 2008/0311386 A1 | 12/2008 | Wendt |
| 2009/0002939 A1 | 1/2009 | Baugh et al. |
| 2009/0015742 A1 | 1/2009 | Liao et al. |
| 2009/0021908 A1 | 1/2009 | Patel et al. |
| 2009/0034192 A1 | 2/2009 | Lin et al. |
| 2009/0051283 A1 | 2/2009 | Cok et al. |
| 2009/0084525 A1 | 4/2009 | Satou et al. |
| 2009/0092261 A1 | 4/2009 | Bard |
| 2009/0097127 A1 | 4/2009 | Amitai |
| 2009/0128449 A1 | 5/2009 | Brown et al. |
| 2009/0128901 A1 | 5/2009 | Tilleman et al. |
| 2009/0180250 A1 | 7/2009 | Holling et al. |
| 2009/0189974 A1 | 7/2009 | Deering |
| 2009/0190003 A1 | 7/2009 | Park et al. |
| 2009/0195756 A1 | 8/2009 | Li et al. |
| 2009/0222147 A1 | 9/2009 | Nakashima et al. |
| 2009/0244413 A1 | 10/2009 | Ishikawa et al. |
| 2009/0256837 A1 | 10/2009 | Deb et al. |
| 2010/0002989 A1 | 1/2010 | Tokushima |
| 2010/0060551 A1 | 3/2010 | Sugiyama et al. |
| 2010/0061078 A1 | 3/2010 | Kim |
| 2010/0084674 A1 | 4/2010 | Paetzold et al. |
| 2010/0096617 A1 | 4/2010 | Shanks |
| 2010/0103078 A1 | 4/2010 | Mukawa et al. |
| 2010/0141905 A1 | 6/2010 | Burke |
| 2010/0188353 A1 | 7/2010 | Yoon et al. |
| 2010/0195280 A1* | 8/2010 | Huang .............. F28D 15/0266 361/679.47 |
| 2010/0200736 A1 | 8/2010 | Laycock et al. |
| 2010/0213467 A1 | 8/2010 | Lee et al. |
| 2010/0220439 A1* | 9/2010 | Qin ..................... 361/679.47 |
| 2010/0229853 A1 | 9/2010 | Vandal et al. |
| 2010/0245387 A1 | 9/2010 | Bachelder et al. |
| 2010/0259889 A1 | 10/2010 | Chen et al. |
| 2010/0271467 A1 | 10/2010 | Akeley |
| 2010/0277439 A1 | 11/2010 | Charlier et al. |
| 2010/0300654 A1 | 12/2010 | Edwards |
| 2010/0309687 A1 | 12/2010 | Sampsell et al. |
| 2010/0315781 A1* | 12/2010 | Agostini .................. 361/700 |
| 2010/0317132 A1 | 12/2010 | Rogers et al. |
| 2010/0321609 A1 | 12/2010 | Qi et al. |
| 2010/0328351 A1 | 12/2010 | Tan |
| 2011/0012814 A1 | 1/2011 | Tanaka |
| 2011/0025605 A1 | 2/2011 | Kwitek |
| 2011/0032482 A1 | 2/2011 | Agurok |
| 2011/0050547 A1 | 3/2011 | Mukawa |
| 2011/0050655 A1 | 3/2011 | Mukawa |
| 2011/0063795 A1 | 3/2011 | Yeh et al. |
| 2011/0075442 A1 | 3/2011 | Chiang |
| 2011/0084893 A1 | 4/2011 | Lee et al. |
| 2011/0090343 A1 | 4/2011 | Alt et al. |
| 2011/0091156 A1 | 4/2011 | Laughlin |
| 2011/0114823 A1 | 5/2011 | Katzir et al. |
| 2011/0127024 A1 | 6/2011 | Patel et al. |
| 2011/0134645 A1 | 6/2011 | Hitchcock et al. |
| 2011/0141388 A1 | 6/2011 | Park et al. |
| 2011/0163986 A1 | 7/2011 | Lee et al. |
| 2011/0194029 A1 | 8/2011 | Herrmann et al. |
| 2011/0205251 A1 | 8/2011 | Auld |
| 2011/0210946 A1 | 9/2011 | Goertz et al. |
| 2011/0214082 A1 | 9/2011 | Osterhout et al. |
| 2011/0215349 A1 | 9/2011 | An et al. |
| 2011/0221658 A1 | 9/2011 | Haddick et al. |
| 2011/0221659 A1 | 9/2011 | King et al. |
| 2011/0222236 A1 | 9/2011 | Luo et al. |
| 2011/0227820 A1 | 9/2011 | Haddick et al. |
| 2011/0235179 A1 | 9/2011 | Simmonds |
| 2011/0242145 A1 | 10/2011 | Nishimura et al. |
| 2011/0242392 A1 | 10/2011 | Chiang |
| 2011/0242757 A1 | 10/2011 | Tracy et al. |
| 2011/0248904 A1 | 10/2011 | Miyawaki et al. |
| 2011/0248958 A1 | 10/2011 | Gruhlke et al. |
| 2011/0267799 A1 | 11/2011 | Epstein et al. |
| 2011/0283223 A1 | 11/2011 | Vaittinen et al. |
| 2011/0299044 A1 | 12/2011 | Yeh et al. |
| 2011/0304640 A1 | 12/2011 | Noge |
| 2011/0309378 A1 | 12/2011 | Lau et al. |
| 2011/0310312 A1 | 12/2011 | Yokote et al. |
| 2012/0013651 A1 | 1/2012 | Trayner et al. |
| 2012/0019434 A1 | 1/2012 | Kuhlman et al. |
| 2012/0026161 A1 | 2/2012 | Chen et al. |
| 2012/0038629 A1 | 2/2012 | Brown et al. |
| 2012/0050144 A1 | 3/2012 | Morlock |
| 2012/0052934 A1 | 3/2012 | Maharbiz et al. |
| 2012/0105487 A1 | 5/2012 | Son et al. |
| 2012/0106170 A1 | 5/2012 | Matthews et al. |
| 2012/0111544 A1 | 5/2012 | Senatori |
| 2012/0113092 A1 | 5/2012 | Bar-Zeev et al. |
| 2012/0157114 A1 | 6/2012 | Alameh et al. |
| 2012/0162764 A1 | 6/2012 | Shimizu |
| 2012/0182687 A1 | 7/2012 | Dighde et al. |
| 2012/0188205 A1 | 7/2012 | Jansson et al. |
| 2012/0206589 A1 | 8/2012 | Crandall |
| 2012/0206880 A1 | 8/2012 | Andres et al. |
| 2012/0218301 A1 | 8/2012 | Miller |
| 2012/0227006 A1 | 9/2012 | Amm |
| 2012/0256856 A1 | 10/2012 | Suzuki et al. |
| 2012/0256963 A1 | 10/2012 | Suzuki et al. |
| 2012/0287381 A1 | 11/2012 | Li et al. |
| 2013/0000871 A1 | 1/2013 | Olson et al. |
| 2013/0033485 A1 | 2/2013 | Kollin et al. |
| 2013/0081779 A1 | 4/2013 | Liao et al. |
| 2013/0093741 A1 | 4/2013 | Akimoto et al. |
| 2013/0106674 A1 | 5/2013 | Wheeler et al. |
| 2013/0162673 A1 | 6/2013 | Bohn |
| 2013/0163089 A1 | 6/2013 | Bohn |
| 2013/0170031 A1 | 7/2013 | Bohn |
| 2013/0186596 A1 | 7/2013 | Rubenstein |
| 2013/0187943 A1 | 7/2013 | Bohn et al. |
| 2013/0207964 A1 | 8/2013 | Fleck |
| 2013/0208003 A1 | 8/2013 | Bohn |
| 2013/0208362 A1 | 8/2013 | Bohn |
| 2013/0208482 A1 | 8/2013 | Fleck |
| 2013/0215081 A1 | 8/2013 | Levin et al. |
| 2013/0228632 A1 | 9/2013 | Kapoor et al. |
| 2013/0242056 A1 | 9/2013 | Fleck |
| 2013/0252628 A1 | 9/2013 | Kuehnel |
| 2013/0257848 A1 | 10/2013 | Westerinen et al. |
| 2013/0258701 A1 | 10/2013 | Westerinen et al. |
| 2013/0267309 A1 | 10/2013 | Robbins |
| 2013/0294030 A1 | 11/2013 | Wang et al. |
| 2013/0307875 A1 | 11/2013 | Anderson |
| 2013/0322810 A1 | 12/2013 | Robbins |
| 2013/0332159 A1 | 12/2013 | Federighi et al. |
| 2013/0333871 A1 | 12/2013 | Pimlott |

(56) References Cited

U.S. PATENT DOCUMENTS

| | | |
|---|---|---|
| 2013/0335671 A1 | 12/2013 | Fleck |
| 2013/0342674 A1 | 12/2013 | Dixon |
| 2014/0010265 A1 | 1/2014 | Peng |
| 2014/0041827 A1 | 2/2014 | Giaimo |
| 2014/0078130 A1 | 3/2014 | Uchino et al. |
| 2014/0094973 A1 | 4/2014 | Giaimo et al. |
| 2014/0104665 A1 | 4/2014 | Popovich et al. |
| 2014/0104685 A1 | 4/2014 | Bohn |
| 2014/0140653 A1 | 5/2014 | Brown et al. |
| 2014/0140654 A1 | 5/2014 | Brown et al. |
| 2014/0184699 A1 | 7/2014 | Ito et al. |
| 2014/0204455 A1 | 7/2014 | Popovich |
| 2016/0171967 A1 | 6/2016 | Giaimo et al. |

FOREIGN PATENT DOCUMENTS

| | | |
|---|---|---|
| CN | 1701629 | 11/2005 |
| CN | 101029968 | 9/2007 |
| CN | 101193535 | 6/2008 |
| CN | 101578029 | 11/2009 |
| CN | 101917835 | 12/2010 |
| CN | 102004315 | 4/2011 |
| CN | 102047155 | 5/2011 |
| CN | 103149994 | 6/2013 |
| EP | 1391673 | 8/2003 |
| EP | 1482396 | 3/2004 |
| EP | 1494109 | 1/2005 |
| EP | 2381290 | 10/2011 |
| JP | H0422358 | 1/1992 |
| JP | 7311303 | 11/1995 |
| JP | 11243289 | 9/1999 |
| JP | 2001078234 | 3/2001 |
| JP | 2003314936 | 11/2003 |
| JP | 2008017135 | 1/2008 |
| JP | 2008258173 | 10/2008 |
| JP | 2008269353 | 11/2008 |
| JP | 2010541238 | 12/2010 |
| KR | 20090076539 | 7/2009 |
| KR | 20110070087 | 6/2011 |
| KR | 20120023458 | 3/2012 |
| WO | WO-9418595 | 8/1994 |
| WO | WO-0195027 | 12/2001 |
| WO | WO-03090611 | 11/2003 |
| WO | WO-2008021504 | 2/2008 |
| WO | WO-2009077601 | 6/2009 |
| WO | WO-2009143330 | 11/2009 |
| WO | WO-2011003381 | 1/2011 |
| WO | WO-2011090455 | 7/2011 |
| WO | WO-2012172295 | 12/2012 |

OTHER PUBLICATIONS

"Non-Final Office Action", U.S. Appl. No. 13/355,836, Nov. 4, 2013, 15 pages.

Barger, Walt "COTS Cooling", *Publication of the National Electronics Manufacturing Center of Excellence*, Retrieved from: <http://www.empf.org/empfasis/2009/Oct09/cots.html> on Jul. 9, 2012,(Oct. 2009), 4 pages.

Jaworski, M. et al., "A Novel Design of Heat Sink with PCM for Electronics Cooling", *10th International Conference on Thermal Energy Storage, Stockton*, May 31-Jun. 2, 2006, retrieved from <https://intraweb.stockton.edu/eyos/energy_studies/content/docs/FINAL_PRESENTATIONS/4b-6%20.pdf> on Jan. 5, 2012,(May 31, 2006), 8 pages.

Krishnan, Shankar et al., "A Novel Hybrid Heat Sink Using Phase Change Materials for Transient Thermal Management of Electronics", *IEEE transactions on components and packaging technologies*, vol. 28, No. 2, retrieved from <http://ieeexplore.ieee.org/stamp/stamp.jsp?tp=&arnumber=1432936> on Jan. 5, 2012,(Jun. 2005), pp. 281-289.

Man, Kaleen et al., "IT Equipment Noise Emission Standards: Overview of New Development in the Next Edition of ISO/ECMA Standards", *In Proceedings of 37th International Congress and Exposition on Noise Control Engineering*, Available at <http://www.ecma-international.org/activities/Acoustics/Inter-noise%202008%20paper%20on%20ECMA-74%20updates.pdf>,(Oct. 26, 2008), 8 pages.

Stupar, Andrija et al., "Optimization of Phase Change Material Heat Sinks for Low Duty Cycle High Peak Load Power Supplies", *IEEE transactions on components, packaging and manufacturing technology*, retrieved from <http://ieeexplore.ieee.org/stamp/stamp.jsp?tp=&arnumber=6081913> on Jan. 5, 2012,(Nov. 15, 2011), 14 pages.

"PCT Search Report and Written Opinion", Application No. PCT/US2013/021783, (May 15, 2013), 9 pages.

"Foreign Notice of Allowance", Chinese Application No. 201320034345.X, (Aug. 14, 2013), 2 Pages.

"Restriction Requirement", U.S. Appl. No. 13/355,836, (Sep. 27, 2013), 6 pages.

Aron, Jacob "'Sprinting' chips could push phones to the speed limit", *New Scientist*, Feb. 20, 2012, Issue #2852, (Feb. 20, 2012), 2 pages.

Chirgwin, Richard "Researchers propose 'overclock' scheme for mobiles—Processing at a sprint to overcome tech limitations", *The Register*, Feb. 21, 2012, (Feb. 21, 2012), 2 pages.

Coldewey, Devin "Researchers Propose "Computational Sprinting" to Speed Up Chips by 1000%—But Only for a Second", *TechCrunch*, Feb. 28, 2012, (Feb. 29, 2012), 2 pages.

Greenemeier, Larry "Could "Computational Sprinting" Speed Up Smart Phones without Burning Them Out?", *Scientific American*, Feb. 29, 2012, (Feb. 29, 2012), 2 pages.

Lerner, Evan "Penn Helps Rethink Smartphone Design With 'Computational Sprinting'", *Penn News Release*, (Feb. 28, 2012), 2 pages.

McMillan, Robert "Your Future iPhone May Be Stuffed With Wax", (Aug. 23, 2013), 3 pages.

Moore, Nicole C., "Computational sprinting pushes smartphones till they're tired", *Michigan News Release*, (Feb. 28, 2012), 2 pages.

Owano, Nancy "Study explores computing bursts for smartphones", PhysOrg.com, Feb. 21, 2012, (Feb. 21, 2012), 2 pages.

Papaefthymiou, Marios et al., "Computational Sprinting on Hardware/Software Testbed", *In the Proceedings of the 18th Eighteenth International Conference on Architectural Support for Programming Languages and Operating Systems (ASPLOS)*, Mar. 2013., (Mar. 2013), 12 pages.

Patrizio, Andy "Researchers Working on Ways to Put 16-Core Processors in Smartphones", *Brighthand*, Mar. 18, 2012, (Mar. 18, 2012), 2 pages.

Raghavan, Arun et al., "Computational Sprinting", *In Proceedings of the 18th Symposium on High Performance Computer Architecture (HPCA)*, Feb. 2012, (Feb. 2012), 12 pages.

Raghavan, Arun et al., "Designing for Responsiveness With Computational Sprinting", *IEEE Micro's "Top Picks of 2012" Issue*, (May 2013), 8 pages.

Tari, et al., "CFD Analyses of a Notebook Computer Thermal Management System and a Proposed Passive Cooling Alternative", Retrieved at <<http://ieeexplore.ieee.org/stamp/stamp.jsp?tp=arnumber=5466211>>, IEEE Transactions on Components and Packaging Technologies, vol. 33, No. 2, Jun. 2010, pp. 443-452.

Nguyen, et al., "Advanced Cooling System Using Miniature Heat Pipes in Mobile PC", Retrieved at <<http://ieeexplore.ieee.org/stamp/stamp.jsp?tp=&arnumber=833046&userType=inst>>, IEEE Transactions on Components and Packaging Technology, vol. 23, No. 1, Mar. 2000, pp. 86-90.

Walker, Tony, "Thermalright Ultra-120 Extreme CPU Cooler", Retrieved at <<http://www.pro-clockers.com/cooling/66-thermalright-ultra-120-extreme-cpu-cooler.html>>, Jul. 2, 2009, pp. 7.

Baxtor Shane, "TwinTech GeForce GTS 250 XT OC 1GB Graphics Card", Retrieved at <<http://www.tweaktown.com/reviews/2733/twintech_geforce_gts_250_xt_oc_1gb_graphics_card/index3.html,>>, Apr. 24, 2009, pp. 4.

"Final Office Action", U.S. Appl. No. 13/355,836, Mar. 10, 2014, 18 pages.

(56) References Cited

OTHER PUBLICATIONS

"International Search Report and Written Opinion", Application No. PCT/US2013/061225, Jun. 4, 2014, 12 pages.
"Notice of Allowance", U.S. Appl. No. 13/355,836, Jun. 13, 2014, 11 pages.
"Corrected Notice of Allowance", U.S. Appl. No. 13/355,836, Sep. 11, 2014, 2 pages.
"Corrected Notice of Allowance", U.S. Appl. No. 13/355,836, Dec. 15, 2014, 2 pages.
"Non-Final Office Action", U.S. Appl. No. 13/570,073, Jan. 23, 2015, 7 pages.
"Notice of Allowance", U.S. Appl. No. 13/355,836, Oct. 8, 2014, 11 pages.
"Restriction Requirement", U.S. Appl. No. 13/570,073, Nov. 18, 2014, 7 pages.
"Written Opinion", Application No. PCT/US2013/061225, Oct. 10, 2014, 6 Pages.
"Advisory Action", U.S. Appl. No. 13/428,879, Sep. 19, 2014, 3 pages.
"BragGrate Mirror", Retrieved from <http://web.archive.org/web/20090814104232/http://www.optigrate.com/BragGrate_Mirror.html> on Jul. 8, 2014, Aug. 14, 2009, 2 pages.
"Corrected Final Office Action", U.S. Appl. No. 13/432,311, Dec. 24, 2014, 25 pages.
"Final Office Action", U.S. Appl. No. 13/336,873, Jan. 5, 2015, 21 pages.
"Final Office Action", U.S. Appl. No. 13/336,895, May 27, 2014, 11 pages.
"Final Office Action", U.S. Appl. No. 13/397,495, May 29, 2014, 10 pages.
"Final Office Action", U.S. Appl. No. 13/397,516, Jan. 29, 2015, 13 pages.
"Final Office Action", U.S. Appl. No. 13/428,879, Jul. 14, 2014, 12 pages.
"Final Office Action", U.S. Appl. No. 13/432,311, Dec. 15, 2014, 24 pages.
"Final Office Action", U.S. Appl. No. 13/432,372, Jan. 29, 2015, 33 pages.
"Final Office Action", U.S. Appl. No. 13/440,165, Jun. 6, 2014, 12 pages.
"Final Office Action", U.S. Appl. No. 13/570,073, Apr. 7, 2015, 7 pages.
"Final Office Action", U.S. Appl. No. 14/134,993, Aug. 20, 2014, 15 pages.
"Foreign Office Action", CN Application No. 201210563730.3, Jan. 7, 2015, 16 pages.
"Foreign Office Action", CN Application No. 201210567932.5, Aug. 14, 2014, 12 pages.
"HDTV Helmet Mounted Display", Available at <http://defense-update.com/products/h/HDTV-HMD.htm>, Jan. 26, 2005, 1 page.
"International Search Report and Written Opinion", Application No. PCT/US2012/069331, Mar. 29, 2013, 10 pages.
"International Search Report and Written Opinion", Application No. PCT/US2013/030632, Jun. 26, 2013, 10 pages.
"International Search Report and Written Opinion", Application No. PCT/US2013/028477, Jun. 21, 2013, 11 pages.
"International Search Report and Written Opinion", Application No. PCT/US2013/031111, Jun. 26, 2013, 11 pages.
"International Search Report and Written Opinion", Application No. PCT/US2012/071563, Apr. 25, 2013, 13 pages.
"International Search Report and Written Opinion", Application No. PCT/US2012/069330, Mar. 28, 2013, 9 pages.
"International Search Report and Written Opinion", Application No. PCT/US2013/026200, Jun. 3, 2013, 9 pages.
"Light Guide Techniques using LED Lamps", Application Brief I-003, retrieved from <http://www.ciri.org.nz/downloads/Lightpipe%20design.pdf> on Jan. 12, 2012, Oct. 14, 2008, 22 pages.
"Non-Final Office Action", U.S. Appl. No. 13/397,495, Nov. 13, 2013, 8 pages.
"Non-Final Office Action", U.S. Appl. No. 13/440,165, Feb. 6, 2014, 12 pages.
"Non-Final Office Action", U.S. Appl. No. 13/336,873, Jul. 25, 2014, 16 pages.
"Non-Final Office Action", U.S. Appl. No. 13/336,895, Oct. 24, 2013, 9 pages.
"Non-Final Office Action", U.S. Appl. No. 13/343,675, Jul. 16, 2013, 9 pages.
"Non-Final Office Action", U.S. Appl. No. 13/397,516, Jun. 12, 2014, 11 pages.
"Non-Final Office Action", U.S. Appl. No. 13/397,516, Nov. 25, 2013, 10 pages.
"Non-Final Office Action", U.S. Appl. No. 13/397,539, Mar. 16, 2015, 9 pages.
"Non-Final Office Action", U.S. Appl. No. 13/397,617, Oct. 9, 2014, 6 pages.
"Non-Final Office Action", U.S. Appl. No. 13/428,879, Feb. 24, 2015, 10 pages.
"Non-Final Office Action", U.S. Appl. No. 13/428,879, Mar. 17, 2014, 10 pages.
"Non-Final Office Action", U.S. Appl. No. 13/432,311, Jul. 8, 2014, 33 pages.
"Non-Final Office Action", U.S. Appl. No. 13/432,372, May 9, 2014, 26 pages.
"Non-Final Office Action", U.S. Appl. No. 13/432,372, Oct. 24, 2014, 27 pages.
"Non-Final Office Action", U.S. Appl. No. 13/440,165, Feb. 13, 2015, 10 pages.
"Non-Final Office Action", U.S. Appl. No. 13/440,165, Oct. 16, 2014, 11 pages.
"Non-Final Office Action", U.S. Appl. No. 13/525,649, Jan. 29, 2014, 7 pages.
"Non-Final Office Action", U.S. Appl. No. 13/525,649, Jun. 5, 2014, 7 pages.
"Non-Final Office Action", U.S. Appl. No. 13/631,308, Feb. 23, 2015, 9 pages.
"Non-Final Office Action", U.S. Appl. No. 14/134,993, Jan. 22, 2015, 17 pages.
"Non-Final Office Action", U.S. Appl. No. 14/134,993, Apr. 17, 2014, 34 pages.
"Notice of Allowance", U.S. Appl. No. 13/336,895, Aug. 11, 2014, 6 pages.
"Notice of Allowance", U.S. Appl. No. 13/343,675, Sep. 16, 2013, 8 pages.
"Notice of Allowance", U.S. Appl. No. 13/356,545, Mar. 28, 2014, 6 pages.
"Notice of Allowance", U.S. Appl. No. 13/488,145, Nov. 19, 2014, 8 pages.
"Restriction Requirement", U.S. Appl. No. 13/397,539, Dec. 1, 2014, 6 pages.
"Restriction Requirement", U.S. Appl. No. 13/488,145, Sep. 8, 2014, 14 pages.
"Supplemental Notice of Allowance", U.S. Appl. No. 13/356,545, Jul. 22, 2014, 2 pages.
"Two-Faced: Transparent Phone with Dual Touch Screens", Retrieved from <http://gajitz.com/two-faced-transparent-phone-with-dual-touch-screens/>, Jun. 7, 2012, 3 pages.
Allen,"ELiXIR—Solid-State Luminaire with Enhanced Light Extraction by Internal Reflection", Journal of Display Technology, vol. 3, No. 2, Available at <http://www.nanolab.uc.edu/Publications/PDFfiles/355.pdf>, Jun. 2007, pp. 155-159.
Baluja,"Non-Intrusive Gaze Tracking Using Artificial Neural Networks", Technical Report CMU-CS-94-102, Available at <http://citeseerx.ist.psu.edu/viewdoc/download?doi=10.1.1.33.4027&rep=rep1&type=pdf>, Jan. 5, 1994, 14 pages.
Baudisch,"Back-of-Device Interaction Allows Creating Very Small Touch Devices", In Proceedings of 27th International Conference on Human Factors in Computing Systems, Retrieved from <http://citeseerx.ist.psu.edu/viewdoc/download?doi=10.1.1.160.3337&rep=rep1&type=pdf>, Apr. 2005, 10 pages.

(56) References Cited

OTHER PUBLICATIONS

Chen,"Strategies for 3D Video with Wide Fields-of-View", IEEE Proceeding Optoelectronics, vol. 148, Issue 2, Available at <http://ieeexplore.ieee.org/stamp/stamp.jsp?tp=&arnumber=926823>, Apr. 2001, pp. 85-90.
Cheng,"Waveguide Displays Based on Polymer-dispersed Liquid Crystals", SPIE Newsroom, Available at <http://spie.org/documents/Newsroom/Imported/003805/003805_10.pdf>, Aug. 12, 2011, 2 pages.
DeAgazio,"Selecting Display Backlighting for Portable, Handheld Devices", Hearst Electronics Products, retrieved from <http://www2.electronicproducts.com/Selecting_display_backlighting_for_portable_handheld_devices-article-farcglobal-feb2008-html.aspx> on Jan. 12, 2012, Jan. 2, 2008, 4 pages.
Eadicicco,"First Transparent Tablet Lets You Touch From Both Sides", Retrieved from <http://blog.laptopmag.com/first-transparent-tablet>, Dec. 26, 2013, 4 pages.
Han,"Accurate diffraction efficiency control for multiplexed volume holographic gratings", Retrieved at: opticalengineering.spiedigitallibrary.org/data/Journals/.../2799_1, 2002, 4 pages.
Jacques,"Polarized Light Imaging of Tissue", Available at <http://www.lumamed.com/documents/5_polarized%20light%20imaging.pdf>, 2004, 17 pages.
Karp,"Planar Micro-optic Solar Concentration using Multiple Imaging Lenses into a Common Slab Waveguide", In Proceedings of SPIE vol. 7407, Available at <http://psilab.ucsd.edu/research/slab_concentration/files/SPIE_Slab_Published.pdf>, Jan. 2009, 11 pages.
Kress,"Exit Pupil for Wearable See-through displays", Downloaded From: http://proceedings.spiedigitallibrary.org/ on Jan. 31, 2015 Terms of Use: http://spiedl.org/terms, 2012, 8 pages.
Large,"Parallel Optics in Waveguide Displays: a Flat Panel Autostereoscopic", Display Technology, Journal of, Retrieved from <http://download.microsoft.com/download/D/2/E/D2E425F8-CF3C-4C71-A4A2-70F9D4081007/ParallelOpticsinWaveguideDisplaysMS090925.Final.pdf>, Jun. 21, 2010, pp. 1-7.
Li,"Design Optimization of Reflective Polarizers for LCD Backlight Recycling", Journal of Display Technology, vol. 5, No. 8, Available at <http://ieeexplore.ieee.org/stamp/stamp.jsp?tp=&arnumber=5196840 >, Aug. 2009, pp. 335-340.
Massenot,"Multiplexed holographic transmission gratings recorded in holographic polymer-dispersed liquid crystals: static and dynamic studies", Retrieved at: http://oatao.univ-toulouse.fr/2874/, 2005, 8 pages.
Melcher,"LCoS for High Performance Displays", In Proceedings of LEOS 2003, Available at <http://ieeexplore.ieee.org/stamp/stamp.jsp?tp=&arnumber=1253048>, Oct. 27, 2003, pp. 812-813.
Minier,"Diffraction Characteristics of Superimposed Holographic gratings in Planar Optical waveguides", IEEE Photonics Technology Letters, vol. 4, No. 10, Oct. 1992, 4 pages.
Pu,"Exposure schedule for multiplexing holograms in photopolymer films", Retrieved at: lo.epfl.ch/webdav/site/lo/shared/1996/OE_35_2824_Oct1996.pdf, Oct. 1996, 6 pages.
Scott,"RearType: Text Entry Using Keys on the Back of a Device", In Proceedings of 12th Conference on Human-Computer Interaction with Mobile Devices and Services, Retrieved from <https://research.microsoft.com/pubs/135609/reartype%20mobilehci.pdf>, Sep. 7, 2010, 9 pages.
Singh"Laser-Based Head-Tracked 3D Display Research", Journal of Display Technology, vol. 6, No. 10, Available at <http://ieeexplore.ieee.org/stamp/stamp.jsp?tp=&arnumber=5462999>, Oct. 2010, pp. 531-543.
Travis,"Collimated Light from a Waveguide for a Display Backlight", Optics Express—Retrieved from <http://download.microsoft.com/download/D/2/E/D2E425F8-CF3C-4C71-A4A2-70F9D4081007/OpticsExpressbacklightpaper.pdf>, Oct. 15, 2009, pp. 19714-19719.
Travis,"The Design of Backlights for View-Sequential 3D", Microsoft Corporation, Available at <http://download.microsoft.com/download/D/2/E/D2E425F8-CF3C-4C71-A4A2-70F9D4081007/Backlightforviewsequentialautostereo.docx>, Jul. 3, 2010, 4 pages.
Van"A Survey of Augmented Reality Technologies, Applications and Limitations", The International Journal of Virtual Reality, 2010, 9(2), Available at <http://www.ijvr.org/issues/issue2-2010/paper1%20.pdf>, Jun. 2010, pp. 1-19.
Westerinen,"Light Guide Display and Field of View", U.S. Appl. No. 13/428,879, filed Mar. 23, 2012, 46 pages.
Wigdor,"LucidTouch: A See-Through Mobile Device", In Proceedings of 20th Annual ACM symposium on User Interface Software and Technology, Retrieved from <http://dl.acm.org/citation.cfm?id=1294259>, Oct. 7, 2007, 10 pages.
Yan,"Multiplexing holograms in the photopolymer with equal diffraction efficiency", 2005, 9 pages.
Zharkova,"Study of the Dynamics of Transmission Gratings Growth on Holographic Polymer-Dispersed Liquid Crystals", International Conference on Methods of Aerophysical Research, ICMAR 2008, 2008, 4 pages.
"Extended European Search Report", EP Application No. 13741406.6, Aug. 21, 2015, 7 pages.
"Final Office Action", U.S. Appl. No. 14/134,993, Jul. 16, 2015, 19 pages.
"Foreign Office Action", CN Application No. 201310024146.5, Sep. 6, 2015, 12 pages.
"Non-Final Office Action", U.S. Appl. No. 13/570,073, Jul. 13, 2015, 10 pages.
"Non-Final Office Action", U.S. Appl. No. 13/631,308, Aug. 13, 2015, 5 pages.
"Foreign Office Action", CN Application No. 201380017348.5, Jan. 14, 2016, 12 pages.
"Final Office Action", U.S. Appl. No. 13/570,073, Mar. 31, 2016, 15 pages.
"Non-Final Office Action", U.S. Appl. No. 13/432,311, Jun. 2, 2015, 25 pages.
"Advisory Action", U.S. Appl. No. 13/432,311, Mar. 24, 2016, 3 pages.
"Supplemental Notice of Allowance", U.S. Appl. No. 14/134,993, Mar. 2, 2016, 6 pages.
"Final Office Action", U.S. Appl. No. 13/432,311, Dec. 18, 2015, 9 pages.
"Notice of Allowance", U.S. Appl. No. 13/631,308, Dec. 18, 2015, 5 pages.
"Final Office Action", U.S. Appl. No. 13/570,073, Nov. 12, 2015, 9 pages.
"Notice of Allowance", U.S. Appl. No. 14/134,993, Nov. 17, 2015, 9 pages.
"Foreign Office Action", CN Application No. 201380030964.4, Feb. 14, 2016, 11 pages.
"Foreign Office Action", CN Application No. 201380030964.4, Sep. 1, 2016, 11 pages.
"Non-Final Office Action", U.S. Appl. No. 13/432,311, Aug. 17, 2016, 18 pages.
"Foreign Office Action", CN Application No. 201380050763.0, Jun. 3, 2016, 11 pages.
"Foreign Office Action", CN Application No. 201380017348.5, Jun. 17, 2016, 7 pages.
"Foreign Office Action", CN Application No. 201310024146.5, May 11, 2016, 8 pages.
"International Preliminary Report on Patentability", Application No. PCT/US2013/061225, Jan. 9, 2015, 9 pages.
"International Search Report", mailed Apr. 30, 2013, received in PCT Application No. PCT/US2013/021784.
"Examiner's Answer to Appeal Brief", U.S. Appl. No. 13/570,073, Dec. 6, 2016, 15 pages.
"Foreign Office Action", CN Application No. 201310024146.5, Nov. 3, 2016, 12 pages.
"Foreign Office Action", CN Application No. 201380017348.5, Oct. 18, 2016, 7 pages.
"Foreign Office Action", JP Application No. 2014-553386, Oct. 28, 2016, 8 pages.

(56) References Cited

OTHER PUBLICATIONS

"Foreign Office Action", CN Application No. 201380050763.0, Feb. 7, 2017, 10 pages.

* cited by examiner

HEAT TRANSFER DEVICE

BACKGROUND

Computing devices are available in an ever increasing variety of configurations. For example, computing devices were traditionally limited to relatively large form factors due to the size of components of the computing devices, such as traditional desktop computers. As component size has decreased, the configurations of the computing devices have expanded from traditional desktop computers to laptop computers, mobile phones (e.g., "smartphones"), tablet computers, gaming devices, and so on.

However, considerations such as heat transfer and noise may become increasingly problematic when confronted with these different configurations. A user of a handheld device, for instance, may be in closer proximity to the device as opposed to a desktop computer. The user, for example, may hold the device and therefore the user is in contact with the device as well as positioned closer to the device than a traditional desktop computer. Therefore, heat of the device, fan noise, and so on may have a greater effect on a user's experience with the device due to this proximity.

SUMMARY

Techniques involving a heat transfer device having a phase change material are described. In one or more implementations, a heat transfer device includes a heat sink and a thermal storage enclosure disposed proximal to at least a portion of the heat sink. The thermal storage enclosure configured to be disposed proximal to a heat-generating component of a device. The thermal storage enclosure includes a phase change material configured to have a melting temperature that is below a temperature at which a cooling fan of the device is set to operate to cool the heat-generating device.

In one or more implementations, a device includes a housing that is moveable through a plurality of orientations involving at least two dimensions during usage, a heat-generating device disposed within the housing, and a heat transfer device disposed within the housing. The heat transfer device has a plurality of heat pipes configured to transfer heat using thermal conductivity and phase transition from the heat-generating device, the plurality of heat pipes arranged to provide generally uniform heat transfer from the heat-generating device during movement of the housing through the plurality of orientations.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different instances in the description and the figures may indicate similar or identical items. Entities represented in the figures may be indicative of one or more entities and thus reference may be made interchangeably to single or plural forms of the entities in the discussion.

DETAILED DESCRIPTION

Overview

Limitations involved with conventional techniques for heat transfer utilized by computing devices and other devices could have an adverse effect on overall functionality of the device. This effect, for instance, may limit functionality that may be incorporated by the device (e.g., speed of a processing system), a user's experience with the device (e.g., noise caused by fans and even an overall temperature of the device when physically contacted by a user), form factors that may be employed by the device (e.g., size and shape of the device that permits sufficient cooling), and so forth.

Heat transfer techniques are described herein. In one or more implementations, a heat transfer device includes a phase change material that may be used to buffer against cycles of high power consumption by a heat-generating device, such as a processing system. For example, the processing system may include a processor, functional blocks, and so on that is configured to operate at different power states, such as a low power state to conserve battery life and a high power state to provide additional processing resources. Accordingly, the processing system may be configured to cycle between these states to provide corresponding functionality. However, the high power state may cause the processing system to generate a greater amount of heat than the low power state. If not addressed, this greater amount of heat could cause damage to the computing device. Consequently, conventional techniques often limited the availability of the high power state to protect against damage to the computing device.

In the techniques described herein, however, a heat transfer device may employ a phase change material that buffers against this additional heat. The phase change material, for instance, may be configured to melt at a temperature that is higher than that encountered during the low power state but lower than a temperature that is encountered during the high power state. Therefore, the melting of the phase change material may cause the temperature of the heat-generating device to remain relatively uniform for an extended period of time, which may be used to buffer against the additional heat generated during the high power state. In this way, the high power state may be made available for an extended period of time, may be utilized without increasing supplemental cooling such as fans that may interfere with a user's experience with the computing device, and so on. Further discussion of these techniques may be found in relation to FIG. 2.

In one or more additional implementations, a heat transfer device is configured to provide generally uniform cooling in different orientations of a computing device. The heat transfer device, for instance, may include first and second heat pipes that are arranged in opposing directions away from a heat-generating device. Therefore, an effect of gravity on the first heat pipe may be compensated for by the second heat pipe and vice versa. Accordingly, the heat transfer device may support heat transfer during movement of a computing device through a variety of different orientations. Further, the heat pipes may be used to support a plurality of fans, which may be utilized to conserve space and improve energy efficiency of the computing device. Further discussion of these techniques may be found in relation to FIG. 3.

In the following discussion, an example environment is first described that may employ the heat transfer techniques described herein. Example procedures are then described which may be performed in the example environment as well as other environments. Consequently, performance of the example procedures is not limited to the example environment and the example environment is not limited to performance of the example procedures.

Example Environment

Figure 1:
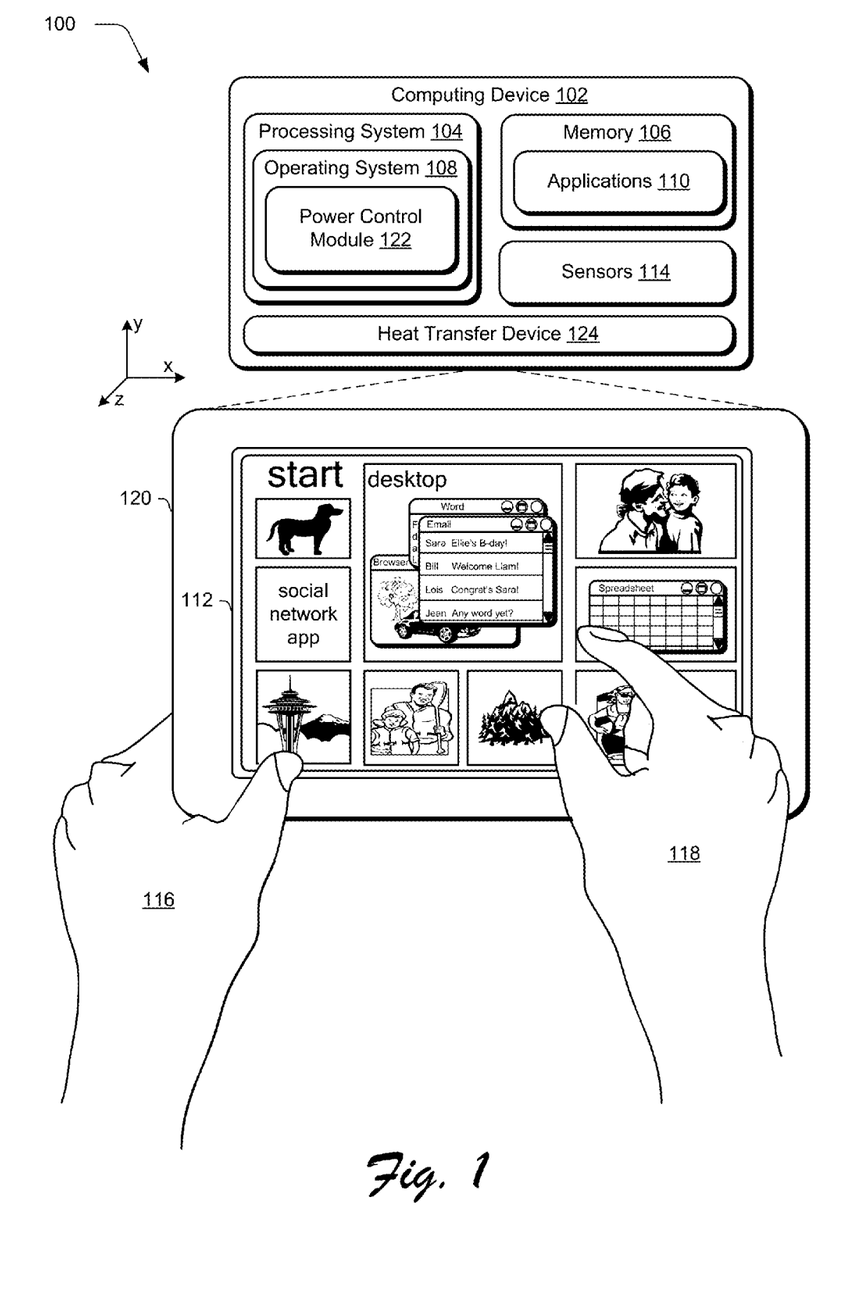
FIG. 1 is an illustration of an environment in an example implementation that is operable to employ a heat transfer device.

FIG. 1 is an illustration of an environment 100 in an example implementation that is operable to employ techniques described herein. The illustrated environment 100 includes a computing device 102 having a processing system 104 and a computer-readable storage medium that is illustrated as a memory 106 although other confirmations are also contemplated as further described below.

The computing device 102 may be configured in a variety of ways. For example, a computing device may be configured as a computer that is capable of communicating over a network, such as a desktop computer, a mobile station, an entertainment appliance, a set-top box communicatively coupled to a display device, a wireless phone, a game console, and so forth. Thus, the computing device 102 may range from full resource devices with substantial memory and processor resources (e.g., personal computers, game consoles) to a low-resource device with limited memory and/or processing resources (e.g., traditional set-top boxes, hand-held game consoles). Additionally, although a single computing device 102 is shown, the computing device 102 may be representative of a plurality of different devices, such as multiple servers utilized by a business to perform operations such as by a web service, a remote control and set-top box combination, an image capture device and a game console configured to capture gestures, and so on. Further discussion of different configurations that may be assumed by the computing device may be found in relation to FIG. 5.

The computing device 102 is further illustrated as including an operating system 108. The operating system 108 is configured to abstract underlying functionality of the computing device 102 to applications 110 that are executable on the computing device 102. For example, the operating system 108 may abstract the processing system 104, memory 106, network, and/or display device 112 functionality of the computing device 102 such that the applications 110 may be written without knowing "how" this underlying functionality is implemented. The application 110, for instance, may provide data to the operating system 108 to be rendered and displayed by the display device 112 without understanding how this rendering will be performed. The operating system 108 may also represent a variety of other functionality, such as to manage a file system and user interface that is navigable by a user of the computing device 102.

The computing device 102 may support a variety of different interactions. For example, the computing device 102 may include one or more hardware devices that are manipulable by a user to interact with the device, such as a keyboard, cursor control device (e.g., mouse), and so on. The computing device 102 may also support gestures, which may be detected in a variety of ways. The computing device 102, for instance, may support touch gestures that are detected using touch functionality of the computing device 102. The sensors 114, for instance, may be configured to provide touchscreen functionality in conjunction with the display device 112, alone as part of a track pad, and so on. An example of this is illustrated in FIG. 1 in which first and second hands 116, 118 of a user are illustrated. The first hand 116 of the user is shown as holding a housing 120 of the computing device 102. The second hand 118 of the user is illustrated as providing one or more inputs that are detected using touchscreen functionality of the display device 112 to perform an operation, such as to make a swipe gesture to pan through representations of applications in the start menu of the operating system 108 as illustrated.

Thus, recognition of the inputs may be leveraged to interact with a user interface output by the computing device 102, such as to interact with a game, an application, browse the internet, change one or more settings of the computing device 102, and so forth. The sensors 114 may also be configured to support a natural user interface (NUI) that may recognize interactions that may not involve touch. For example, the sensors 114 may be configured to detect inputs without having a user touch a particular device, such as to recognize audio inputs through use of a microphone. For instance, the sensors 114 may include a microphone to support voice recognition to recognize particular utterances (e.g., a spoken command) as well as to recognize a particular user that provided the utterances.

In another example, the sensors 114 may be configured to detect movement of the computing device 102 in one or more dimensions, such as the x, y, and z dimensions as illustrated, through use of accelerometers, gyroscopes, inertial measurement units (IMUs), magnetometers, and so on. This movement may be recognized in whole in part as part of a definition of a gesture. For example, movement of the computing device 102 in the z axis may be used to zoom in a user interface displayed on the display device 112, rotation through the x axis may be used to steer a car in a video game, and so on. Thus, in this example the computing device 102 may be moved through a variety of different orientations to support interaction with the device.

In a further example, the sensors 114 that may be configured to recognize gestures, presented objects, images, and so on through implementations as one or more cameras. The cameras, for instance, may be configured to include multiple lenses so that different perspectives may be captured and thus determine depth. The different perspectives, for instance, may be used to determine a relative distance from the sensors 114 and thus a change in the relative distance. The different perspectives may be leveraged by the computing device 102 as depth perception. The images may also be leveraged by the computing device 102 to support a variety of other functionality, such as techniques to identify particular users (e.g., through facial recognition), objects, and so on. It should also be noted that the sensors 114 may also support detection of movement as described above in one or more of the x, y, or z axes through implementation as a camera.

The computing device 102 is further illustrated as including a power control module 122. The power control module 122 is representative of functionality to cause a device to enter different power consumption states. The processing system 104, for instance, may be configured to support a low power state in which processing resources are lessened and power consumption of the processing system 104 is also lessened. Thus, the processing system 104 may be configured to conserve resources (e.g., from a battery) while in this low power state.

The processing system 104 may also be configured to support a high power state in which additional processing resources are made available and is provided with a corresponding increase in power consumption. Thus, the processing system 104 may utilize the high power state when additional processing resources are desired but by doing so consume more battery resources than when operating in the low power state. Therefore, the processing system 104 may be configured to cycle between these states to provide desired functionality, e.g., to conserve power or increase processing resources.

Use of the processing system 104 in the high power state, however, may result in additional heat generation than in low high power state. Additionally, it may be observed by a product designer that the processing system 104 typically cycles to the high power state for a relatively short amount of time, e.g., twenty seconds or less. However, convention heat transfer techniques may be forced to perform actions that may interfere with the user's experience with the computing device 102, such as to increase a speed of one or more fans of the computing device 102 to cool the processing system 104. Techniques are described herein, however, in which a heat transfer device 124 may support integrated heat storage to buffer against such changes, further discussion of which may be found in relation to the following figure.

Figure 2:
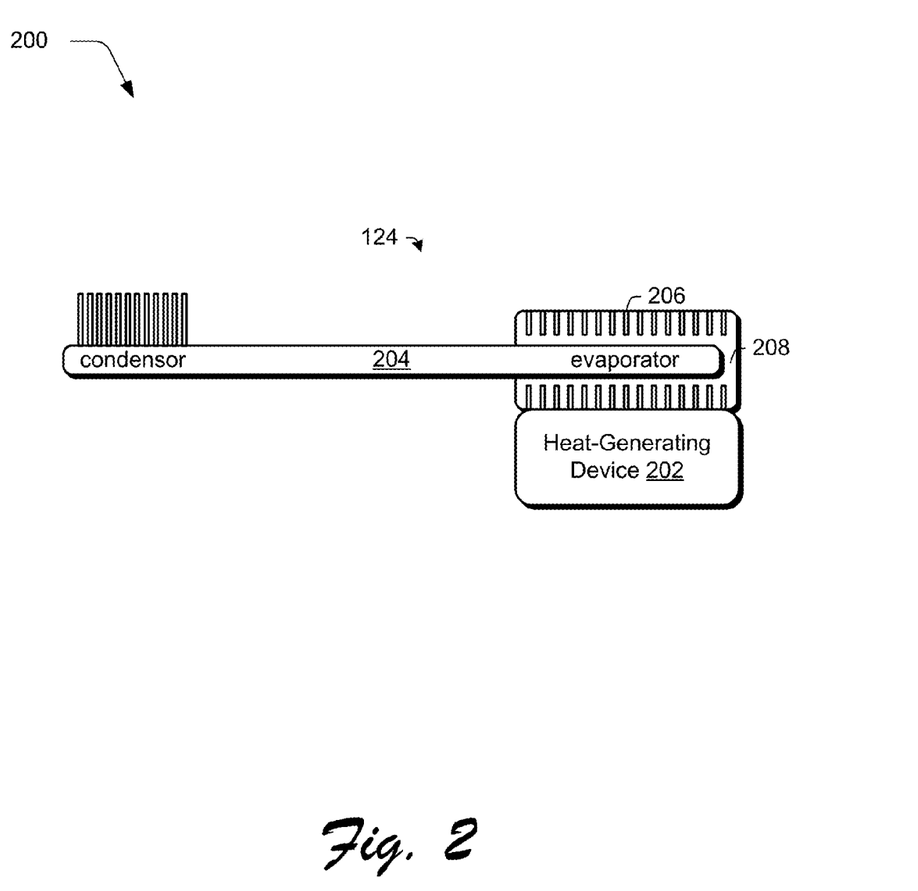
FIG. 2 depicts an example implementation showing a heat transfer device of FIG. 1 as supporting integrated heat storage.

FIG. 2 depicts an example implementation 200 showing the heat transfer device 124 of FIG. 1 as supporting integrated heat storage. The heat transfer device 124 is illustrated as being disposed proximal to a heat-generating device 202, such as a processing system 104 as described in relation to FIG. 1 although other heat-generating devices are also contemplated such as other electrical devices of a computing device or other apparatus.

The heat transfer device 124 in this example includes a heat pipe 204. The heat pipe 204 is configured to transfer heat away from the heat-generating device 202 through use of thermal conductivity and phase transition. For example, the heat pipe 202 may be formed as an enclosed tube from a thermally conductive material, e.g., a metal such as copper, and thus may conduct heat away from the heat-generating device 202 using thermal conductivity.

The tube may include material disposed therein that is configured to undergo a phase transition, such as from a liquid to a gas in this example. An evaporator portion of the heat pipe, for instance, may be disposed proximal to a heat source from which heat is to be transferred, e.g., the heat-generating device 202. Liquid disposed at the evaporator portion may absorb heat until a phase transition occurs to form a gas. The gas may then travel through the tube using convection to be cooled at a condenser portion of the heat pipe 204, e.g., through use of one or more heat cooling fins as illustrated such as forced convection fins, by air movement caused through use of one or more fans, and so on.

Cooling of the gas may cause the material to undergo another phase transition back to a liquid as the heat is released. The liquid may then move back toward the evaporator portion of the heat pipe 204 and this process may be repeated. Although a heat pipe 204 is described in this example a variety of different heat sinks are contemplated, such as a folded-fin heat sink, a heat sink with a vapor chamber, a heat sink with a solid metal base, and so forth.

The heat transfer device 124 is further illustrated as including a thermal storage enclosure 206. The thermal storage enclosure 206 in this example also includes a phase change material 208 disposed therein. The phase change material 208 is also configured to undergo a phase change to transfer heat away from the heat-generating device. The phase change may be the same as or different from the phase change described in relation to the heat sink 204, such as to involve a change from a liquid to a gas and back again as described for the heat pipe 204, from solid to a liquid and back again, and so forth. This may be used to support a variety of different functionality.

As previously described, for instance, the heat-generating device 202 may be configured to cycle between low and high power states. For example, the heat-generating device 202 may be configured as a processor of the processing system 104. The processing system 104 may be configured to consume fifteen watts of power in a low power state, at which the processing system 104 may operate at approximately forty degrees Celsius. The processing system 104 may also be configured to cycle to a high power state, such as to consume sixty watts, which may result in production of significantly greater amounts of heat and a corresponding increase in temperature. Accordingly, a product designer of the computing device 102 may configure the thermal storage enclosure 206 to buffer against this cycling to improve an overall user experience with the computing device 102 as well as improve operation of the computing device 102, itself, such as to reduce power consumption.

A product designer of the computing device 102, for instance, may observe that typical usage of the computing device 102 may involve relatively short amounts of time to cycle to the high power state, such as less than twenty seconds to process content of a webpage, open an application 110, and so on. Conventional techniques that were utilized to address heat generated from this higher power consumption, however, typically involved increasing a speed of a fan utilized to cool the device, which resulted in increased noise experienced by a user of the device. If such power consumption continued, techniques may also be employed in which the heat-generating device 202 is switched back to a low power state, thereby making the resources of the high power state unavailable for use by the computing device 102.

In the techniques described herein, however, the product designer may choose an amount and type of a phase change material to buffer against these cycles. Continuing with the previous example, the product designer may choose a phase change material that is configured to melt at a temperature above a temperature achieved by the heat-generating device 202 during a low power state, such as a paraffin wax that is configured to melt at approximately forty five degrees Celsius.

Further, an amount of the phase change material may be included within the thermal storage enclosure 206 such that an entirety of the phase change material does not undergo a phase transition during the observed cycle to the high power state. Again, continuing with the previous example the product designer may observe that the processing system 104 typically cycles to the high power state for less than twenty seconds. Accordingly, an amount of phase change material 208 may be chosen for inclusion in the thermal storage enclosure 206 that at least a portion of the material would not melt during this observed period of time by the processing system 104.

Therefore, the processing system 104 may continue to operate in a high power state without encountering a significant rise in temperature due to heat absorption performed by the phase change material 208 in undergoing the change from solid to liquid in this example. The phase change material 208 may then be cooled back to a solid state after the processing system 104 or other heat-generating device 202 returns to a low power state, e.g., through cooling of the thermal storage enclosure 206 itself, through use of the heat pipe 204, and so on. In this way, supplemental cooling techniques such as an increase in fan speed are not employed unless the high power state continues past the typically observed cycle times, thereby preserving a user experience with the computing device 102 by being "less noisy" as well as conserve power of a battery of the computing device 102 by not increasing a speed of a fan.

For example, the processing system 104 may operate at a low power state at a temperate that is below a temperature at which the phase change material 208 is configured to undergo a phase change, e.g., from a solid to a liquid. The processing system 104 may then cycle to a high power state, such as to load an application, render a webpage, and so on. The high power state may cause an increase in power consumption and a corresponding increase in heat production. Accordingly, the phase change material 208 may begin absorption of this heat by initiating a phase change of at least part of the material, e.g., part of the material may begin to melt.

During the phase change of at least a portion of the phase change material, the thermal storage enclosure 206 may maintain a temperature at which the phase change is configured to occur, e.g., approximately forty five degrees. Consequently, the processing system 104 may continue operating in the high power state at this temperature. Once the phase change material 208 has melted completely, the temperature of the processing system 104 may begin to rise above the temperature at which the phase change of the phase change material 208 occurs.

This rise in temperature may be lessened by other devices of the computing device 102, such as through use of the heat pipe 204 to transfer heat away from the thermal storage enclosure 206, e.g., to the condenser. In one or more implementations, the computing device 102 may employ a threshold temperature that is set above a temperature at which the phase change of the phase change material 208 occurs to trigger an increase in speed of a fan of the computing device, e.g., to turn a fan on, increase the fan speed of an already circulating fan, and so on. In this way, the phase change material 208 of the thermal storage enclosure 206 may buffer against active cooling techniques (e.g., use of the fan) thereby conserving resources of a battery of computing device 102, improving a user's experience with the computing device 102 by lessening noise caused by operation of the fan, and so on. Further discussion of usage of the thermal storage enclosure 206 as part of the heat transfer device 124 may be found in relation to FIG. 4.

As previously described, the computing device 102 may be configured in a variety of ways. In some instances, those configurations may involve movement through and usage of the computing device 102 in a plurality of orientations in three dimensional space. Accordingly, the heat transfer device 124 may be configured to support heat transfer in these different orientations. One example of this is illustrated in FIG. 2 through inclusion of a plurality of fins within the thermal storage enclosure 206. These fins may be used to promote contact between the thermal storage enclosure 206 and the phase change material 208 disposed therein. Further, use of the fins may also promote contact to be retained between the thermal storage enclosure 206 and the phase change material 208 when the heat transfer device 124 is moved and/or used in a variety of different orientations, e.g., rotated, "flipped over," rested on a surface, "held upright," and so on. The heat transfer device 124 may also be configured in a variety of other ways to support operation in different orientations, another example of which may be found in relation to the following figure.

Figure 3:
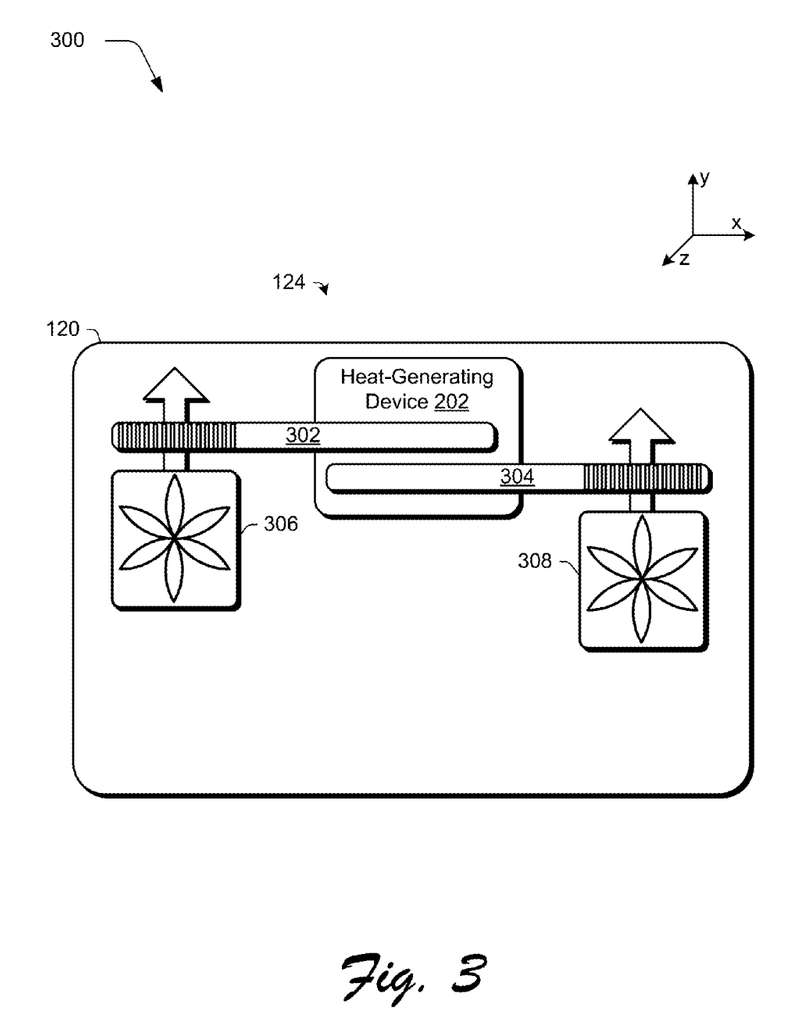
FIG. 3 depicts an example implementation showing a heat transfer device of FIG. 1 as supporting generally uniform heat transfer through a variety of different orientations.

FIG. 3 depicts an example implementation 300 in which the heat transfer device of FIG. 1 is configured to provide generally uniform cooling when placed in a variety of different orientations. In this example, the heat transfer device 124 includes a plurality of heat pipes, shown as first and second heat pipes 302, 304. The first and second heat pipes 302, 304 are configured to conduct heat away from a heat-generating device 202 as before. For example, the first and second heat pipes 302, 304 may be configured to leverage thermal conductivity and phase transition. Thus, the first and second heat pipes 302, 304 may include evaporator portions disposed proximal to the heat-generating device 202, e.g., thermally coupled through a spread plate, and condenser portions disposed away from the heat-generating device 202. The condenser portions of the first and second heat pipes 302, 304 are illustrated as including fins in the example implementation 300, e.g., forced convection fins, and being cooled by first and second fans, 306, 308, respectively.

The heat transfer device 124 is illustrated as including heat pipes arranged to provide generally uniform heat transfer from the heat-generating device 202 through a plurality of different orientations in one or more of the x, y, or z axis. For example, heat pipes are partially driven by gravity force. Therefore, orientation of a heat pipe relative to gravity may have an effect on the heat pipe's thermal load carrying capability.

Accordingly, the first and second heat pipes 302, 304 in the illustrated example are illustrated as being arranged in generally opposing directions from the heat-generating device 202. Arrangement of the first and second heat pipes 302, 304 in the opposing directions may be utilized to support a variety of features. For example, during movement of the heat transfer device 124 through different orientations, one of the heat pipes may have a higher performance due to gravity than the opposing heat pipe. Therefore, this higher performance may help to reduce and even cancel lower performance experienced by the heat pipe that does not have this advantage. In this way, the heat transfer device 124 may provide generally uniform heat transfer from the heat-generating device 202 in a variety of different orientations. Although two heat pipes are described in this example, the heat transfer device 124 may employ different numbers of heat pipes arranged in different orientations without departing from the spirit and scope thereof, such as to employ an arrangement that coincides with contemplated orientations in which the computing device 102 is to be used.

In the illustrated example, the heat transfer device 124 is further illustrated as being cooled by a plurality of fans, examples of which are illustrated as first and second fans 306, 308 to cool the first and second heat pipes 302, 304, respectively. Use of more than one fan by the computing device 102 may support a variety of different features. For example, use of the first and second fans 306, 308 may occupy a smaller amount of system "footprint" within the housing 120 than that consumed by a single fan of equal cooling performance. For instance, the first and second fans 306, 308 may consume less space in the housing 120 along the y axis in the illustrated example. Further, two or more fans are able to operate with greater efficiency than a single fan that offers similar cooling performance. For example, power consumption by a fan increases as a third power of fan speed. Therefore, a single fan that operates at twice the speed of two fans consumes twice as much power as the two fans. Thus, the heat transfer device 124 may be configured in a variety of ways to provide a variety of different functionality as previously described.

Example Procedures

The following discussion describes heat transfer techniques that may be implemented utilizing the previously described systems and devices. Aspects of each of the procedures may be implemented in hardware, firmware, or software, or a combination thereof. The procedures are shown as a set of blocks that specify operations performed by one or more devices and are not necessarily limited to the orders shown for performing the operations by the respective blocks. In portions of the following discussion, reference will be made to the environment 100 of FIG. 1 and the example implementations 200, 300 of FIGS. 2 and 3, respectively.

Figure 4:
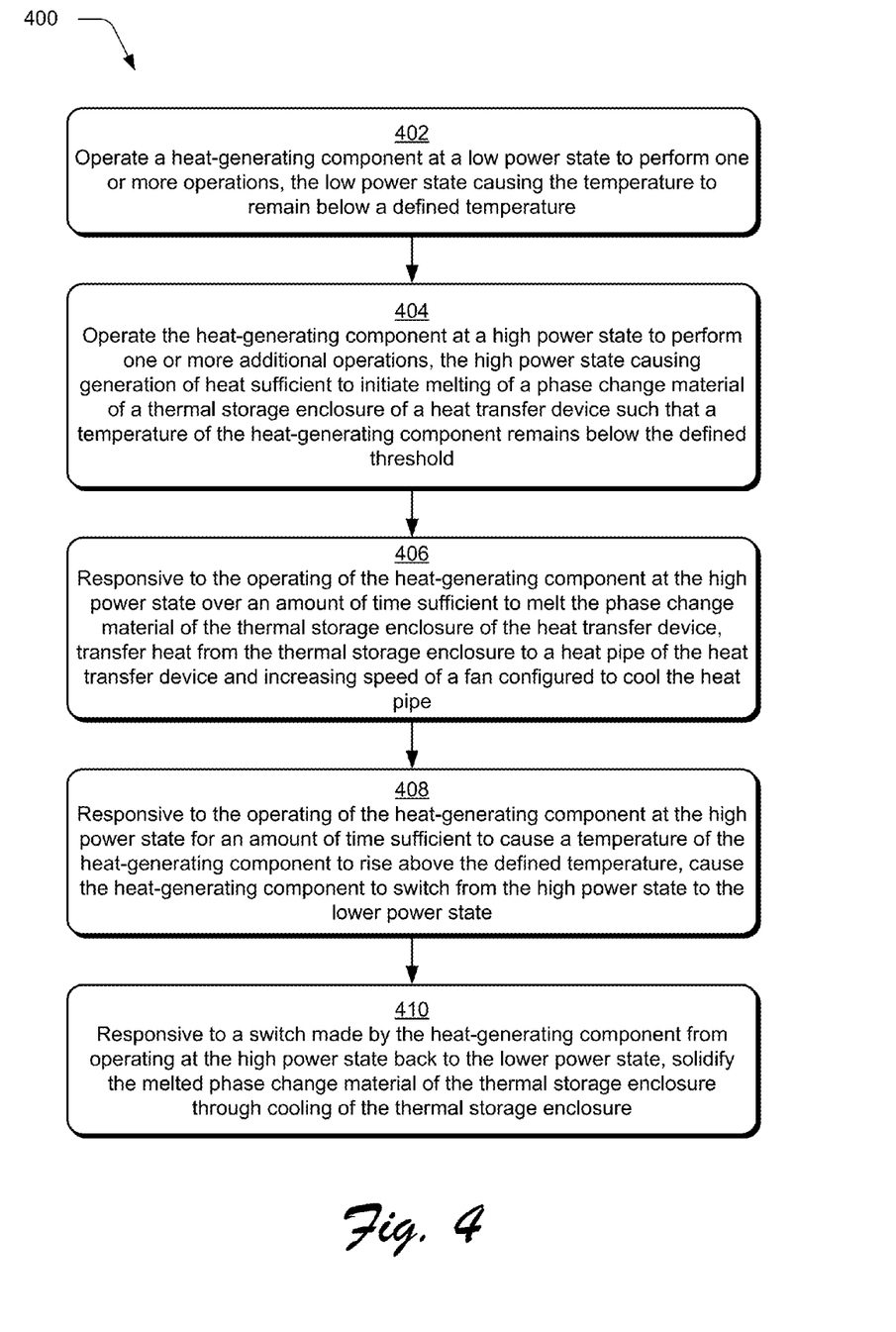
FIG. 4 is a flow diagram depicting a procedure in an example implementation in which a heat transfer device employs a phase change material to buffer heat transfer from a heat-generating device that assumes both high and low power states.

FIG. 4 depicts a procedure 400 in an example implementation in which a heat transfer device employs a phase change material to buffer heat transfer from a heat-generating device that assumes both high and low power states. A heat-generating component is operated at a low power state to perform one or more operations, the low power state causing the temperature to remain below a defined temperature (block 402). The processing system 104, for instance, may operate in a low power state that consumes fifteen watts that causes the processing system 104 to remain at forty degrees Celsius.

The heat-generating component is then operated at a high power state to perform one or more additional operations, the high power state causing generation of heat sufficient to initiate melting of a phase change material of a thermal storage enclosure of a heat transfer device such that a temperature of the heat-generating component remains below the defined threshold (block 404). The processing system 104 may switch from the low power state above to a high power state, such as to consume sixty watts, to make additional processing resources available. This may be performed for a variety of purposes, such as to open an application, render web content, and so on. This may cause a temperature of the processing system 104 to rise to a temperature that causes the phase change material 208 of the thermal storage enclosure 206 to begin melting. This causes the temperature of the processing system 104 to remain at the melting point of the phase change material 208 during the phase change, i.e., as long as there is phase change material available to undergo the change from solid to liquid.

Responsive to the operating of the heat-generating component at the high power state over an amount of time sufficient to melt the phase change material of the thermal storage enclosure of the heat transfer device, heat is transferred from the thermal storage enclosure to a heat pipe of the heat transfer device and increasing speed of a fan configured to cool the heat pipe (block 406). The processing system 104, for instance, may continue to operate until the phase change material 208 is melted. After which, this may then cause a rise in the temperature of the processing system 104 above the melting point of the phase change material. Accordingly, the heat transfer device may employ techniques to reduce this rise in temperature, such as through use of the heat pipe 204, one or more fans, and so forth.

Responsive to the operating of the heat-generating component at the high power state for an amount of time sufficient to cause a temperature of the heat-generating component to rise above the defined temperature, the heat-generating component is caused to switch from the high power state to the low power state (block 408). The power control module 122, for instance, may employ a threshold to limit a temperature at which the processing system 104 is permitted to reach, such as to limit damage that may occur to the processing system 104 or other components of the computing device 102. Therefore, once this temperature is reached the power control module 122 may switch the processing system 104 from the high power state back to the low power state to reduce heat generation by the device.

Responsive to a switch made by the heat-generating component from operating at the high power state back to the low power state, the melted phase change material of the thermal storage enclosure is solidified through cooling of the thermal storage enclosure (block 410). Continuing with the previous example, because the processing system 104 is now operating at a low power state, the processing system 104 may return to a temperature of approximately forty degrees Celsius. Therefore, the phase change material 208 may be cooled and return to a solid form. A variety of other examples are also contemplated, such as an example in which the high power state is cycled for a time that does not cause an entirety of the phase change material 208 to melt, thereby avoiding use of supplemental cooling techniques, such as a fan or other active techniques as previously described.

Example System and Device

Figure 5:
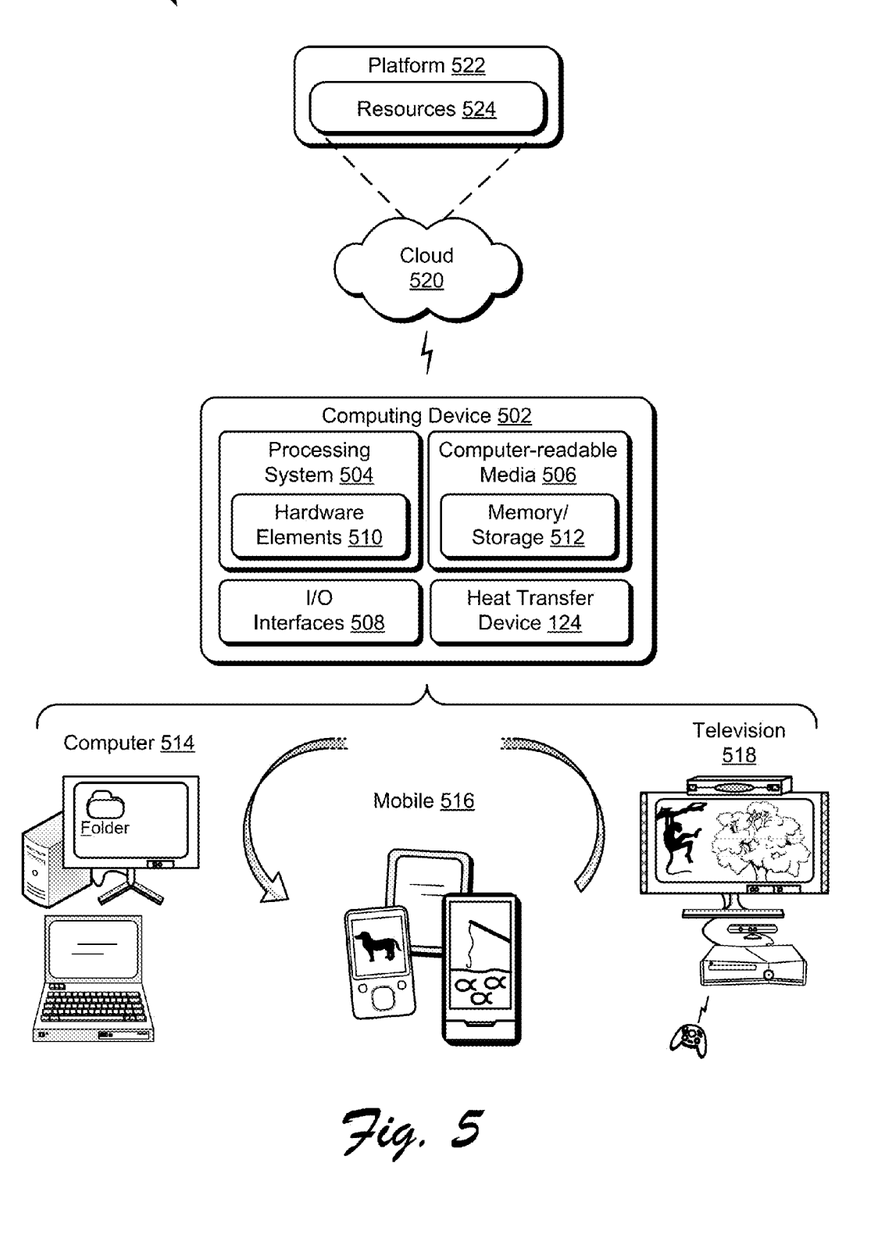
FIG. 5 illustrates an example system including various components of an example device that can be implemented as any type of computing device as described with reference to FIGS. 1-3 to implement embodiments of the techniques described herein.

FIG. 5 illustrates an example system generally at 500 that includes an example computing device 502 that is representative of one or more computing systems and/or devices that may implement the various techniques described herein. The computing device 502 may be, for example, a server of a service provider, a device associated with a client (e.g., a client device), an on-chip system, and/or any other suitable computing device or computing system.

The example computing device 502 as illustrated includes a processing system 504, one or more computer-readable media 506, and one or more I/O interface 508 that are communicatively coupled, one to another. Although not shown, the computing device 502 may further include a system bus or other data and command transfer system that couples the various components, one to another. A system bus can include any one or combination of different bus structures, such as a memory bus or memory controller, a peripheral bus, a universal serial bus, and/or a processor or local bus that utilizes any of a variety of bus architectures. A variety of other examples are also contemplated, such as control and data lines.

The processing system 504 is representative of functionality to perform one or more operations using hardware. Accordingly, the processing system 504 is illustrated as including hardware element 510 that may be configured as processors, functional blocks, and so forth. This may include implementation in hardware as an application specific integrated circuit or other logic device formed using one or more semiconductors. The hardware elements 510 are not limited by the materials from which they are formed or the processing mechanisms employed therein. For example, processors may be comprised of semiconductor(s) and/or transistors (e.g., electronic integrated circuits (ICs)). In such a context, processor-executable instructions may be electronically-executable instructions.

The computer-readable storage media 506 is illustrated as including memory/storage 512. The memory/storage 512 represents memory/storage capacity associated with one or more computer-readable media. The memory/storage component 512 may include volatile media (such as random access memory (RAM)) and/or nonvolatile media (such as read only memory (ROM), Flash memory, optical disks, magnetic disks, and so forth). The memory/storage component 512 may include fixed media (e.g., RAM, ROM, a fixed hard drive, and so on) as well as removable media (e.g., Flash memory, a removable hard drive, an optical disc, and so forth). The computer-readable media 506 may be configured in a variety of other ways as further described below.

Input/output interface(s) 508 are representative of functionality to allow a user to enter commands and information to computing device 502, and also allow information to be presented to the user and/or other components or devices using various input/output devices. Examples of input devices include a keyboard, a cursor control device (e.g., a mouse), a microphone, a scanner, touch functionality (e.g., capacitive or other sensors that are configured to detect physical touch), a camera (e.g., which may employ visible or non-visible wavelengths such as infrared frequencies to recognize movement as gestures that do not involve touch), and so forth. Examples of output devices include a display device (e.g., a monitor or projector), speakers, a printer, a network card, tactile-response device, and so forth. Thus, the computing device 502 may be configured in a variety of ways as further described below to support user interaction.

Various techniques may be described herein in the general context of software, hardware elements, or program modules. Generally, such modules include routines, programs, objects, elements, components, data structures, and so forth that perform particular tasks or implement particular abstract data types. The terms "module," "functionality," and "component" as used herein generally represent software, firmware, hardware, or a combination thereof. The features of the techniques described herein are platform-independent, meaning that the techniques may be implemented on a variety of commercial computing platforms having a variety of processors.

An implementation of the described modules and techniques may be stored on or transmitted across some form of computer-readable media. The computer-readable media may include a variety of media that may be accessed by the computing device 502. By way of example, and not limitation, computer-readable media may include "computer-readable storage media" and "computer-readable signal media."

"Computer-readable storage media" may refer to media and/or devices that enable persistent and/or non-transitory storage of information in contrast to mere signal transmission, carrier waves, or signals per se. Thus, computer-readable storage media refers to non-signal bearing media. The computer-readable storage media includes hardware such as volatile and non-volatile, removable and non-removable media and/or storage devices implemented in a method or technology suitable for storage of information such as computer readable instructions, data structures, program modules, logic elements/circuits, or other data. Examples of computer-readable storage media may include, but are not limited to, RAM, ROM, EEPROM, flash memory or other memory technology, CD-ROM, digital versatile disks (DVD) or other optical storage, hard disks, magnetic cassettes, magnetic tape, magnetic disk storage or other magnetic storage devices, or other storage device, tangible media, or article of manufacture suitable to store the desired information and which may be accessed by a computer.

"Computer-readable signal media" may refer to a signal-bearing medium that is configured to transmit instructions to the hardware of the computing device 502, such as via a network. Signal media typically may embody computer readable instructions, data structures, program modules, or other data in a modulated data signal, such as carrier waves, data signals, or other transport mechanism. Signal media also include any information delivery media. The term "modulated data signal" means a signal that has one or more of its characteristics set or changed in such a manner as to encode information in the signal. By way of example, and not limitation, communication media include wired media such as a wired network or direct-wired connection, and wireless media such as acoustic, RF, infrared, and other wireless media.

As previously described, hardware elements 510 and computer-readable media 506 are representative of modules, programmable device logic and/or fixed device logic implemented in a hardware form that may be employed in some embodiments to implement at least some aspects of the techniques described herein, such as to perform one or more instructions. Hardware may include components of an integrated circuit or on-chip system, an application-specific integrated circuit (ASIC), a field-programmable gate array (FPGA), a complex programmable logic device (CPLD), and other implementations in silicon or other hardware. In this context, hardware may operate as a processing device that performs program tasks defined by instructions and/or logic embodied by the hardware as well as a hardware utilized to store instructions for execution, e.g., the computer-readable storage media described previously.

Combinations of the foregoing may also be employed to implement various techniques described herein. Accordingly, software, hardware, or executable modules may be implemented as one or more instructions and/or logic embodied on some form of computer-readable storage media and/or by one or more hardware elements 510. The computing device 502 may be configured to implement particular instructions and/or functions corresponding to the software and/or hardware modules. Accordingly, implementation of a module that is executable by the computing device 502 as software may be achieved at least partially in hardware, e.g., through use of computer-readable storage media and/or hardware elements 510 of the processing system 504. The instructions and/or functions may be executable/operable by one or more articles of manufacture (for example, one or more computing devices 502 and/or processing systems 504) to implement techniques, modules, and examples described herein.

As further illustrated in FIG. 5, the example system 500 enables ubiquitous environments for a seamless user experience when running applications on a personal computer (PC), a television device, and/or a mobile device. Services and applications run substantially similar in all three environments for a common user experience when transitioning from one device to the next while utilizing an application, playing a video game, watching a video, and so on.

In the example system 500, multiple devices are interconnected through a central computing device. The central computing device may be local to the multiple devices or may be located remotely from the multiple devices. In one embodiment, the central computing device may be a cloud of one or more server computers that are connected to the multiple devices through a network, the Internet, or other data communication link.

In one embodiment, this interconnection architecture enables functionality to be delivered across multiple devices to provide a common and seamless experience to a user of the multiple devices. Each of the multiple devices may have different physical requirements and capabilities, and the central computing device uses a platform to enable the delivery of an experience to the device that is both tailored to the device and yet common to all devices. In one embodiment, a class of target devices is created and experiences are tailored to the generic class of devices. A class of devices may be defined by physical features, types of usage, or other common characteristics of the devices.

In various implementations, the computing device 502 may assume a variety of different configurations, such as for computer 514, mobile 516, and television 518 uses. Each of these configurations includes devices that may have generally different constructs and capabilities, and thus the computing device 502 may be configured according to one or more of the different device classes. For instance, the computing device 502 may be implemented as the computer 514 class of a device that includes a personal computer, desktop computer, a multi-screen computer, laptop computer, netbook, and so on.

The computing device 502 may also be implemented as the mobile 516 class of device that includes mobile devices, such as a mobile phone, portable music player, portable gaming device, a tablet computer, a multi-screen computer, and so on. The computing device 502 may also be implemented as the television 518 class of device that includes devices having or connected to generally larger screens in casual viewing environments. These devices include televisions, set-top boxes, gaming consoles, and so on.

The techniques described herein may be supported by these various configurations of the computing device 502 and are not limited to the specific examples of the techniques described herein.

Functionality may also be implemented all or in part through use of a distributed system, such as over a "cloud" 520 via a platform 522 as described below. The cloud 520 includes and/or is representative of a platform 522 for resources 524. The platform 522 abstracts underlying functionality of hardware (e.g., servers) and software resources of the cloud 520. The resources 524 may include applications and/or data that can be utilized while computer processing is executed on servers that are remote from the computing device 502. Resources 524 can also include services provided over the Internet and/or through a subscriber network, such as a cellular or Wi-Fi network.

The platform 522 may abstract resources and functions to connect the computing device 502 with other computing devices. The platform 522 may also serve to abstract scaling of resources to provide a corresponding level of scale to encountered demand for the resources 524 that are implemented via the platform 522. Accordingly, in an interconnected device embodiment, implementation of functionality described herein may be distributed throughout the system 500. For example, the functionality may be implemented in part on the computing device 502 as well as via the platform 522 that abstracts the functionality of the cloud 520.

CONCLUSION

Although the invention has been described in language specific to structural features and/or methodological acts, it is to be understood that the invention defined in the appended claims is not necessarily limited to the specific features or acts described. Rather, the specific features and acts are disclosed as example forms of implementing the claimed invention.

What is claimed is:

1. A device comprising:
   a housing that is moveable through a plurality of orientations involving at least two dimensions during usage;
   a heat-generating device disposed within the housing; and
   a heat transfer device disposed within the housing comprising:
      a thermal storage enclosure disposed proximal to the heat-generating device and configured to transfer heat from the heat-generating device using thermal conductivity and phase transition by a phase change material included within the thermal storage enclosure, the phase change material configured to undergo the phase transition at a temperature above a first temperature achieved by the heat-generating device operating at a low power state and below a second temperature achieved by the heat-generating device operating at a high power state; and
      a plurality of enclosed heat pipes configured to:
         transfer heat using thermal conductivity and phase transition from the thermal storage enclosure;
      the plurality of enclosed heat pipes arranged to:
         transfer heat from the heat-generating device during movement of the housing through the plurality of orientations;
      the plurality of enclosed heat pipes including:
         first and second heat pipes arranged in opposing directions, each of the first and second heat pipes having an evaporator portion and a condenser portion, the condenser portions of the first and second heat pipes are positioned further from each other than the evaporator portions of the first and second heat pipes, each of the plurality of enclosed heat pipes including the same phase change material within the thermal storage enclosure or a different phase change material configured to undergo a different phase transition than the phase transition of the phase change material within the thermal storage enclosure.

2. A device as described in claim 1, wherein:
   the thermal storage enclosure includes an amount of the phase change material within the thermal storage enclosure, the amount of the phase change material effective to allow a portion of the phase change material to not undergo the phase transition when the heat-generating device is operating in the high power state for a threshold period of time.

3. A device as described in claim 1, further comprising a plurality of fans disposed within the housing such that at least two of the plurality of enclosed heat pipes is configured to be cooled by a respective said fan.

4. A device as described in claim 1, further comprising a display device and wherein the housing is configured to assume at least one orientation in which the display device is viewable by a user in a landscape orientation and at least two of the plurality of enclosed heat pipes are arranged horizontally when in the landscape orientation.

5. A device as described in claim 1, wherein the housing is configured to be held by one or more hands of a user and moved through the at least two dimensions during usage.

6. A device as described in claim 5, wherein the housing is configured for use as a mobile communications device.

7. A device as described in claim 1, wherein each of the plurality of enclosed heat pipes is thermally coupled to the heat-generating device through use of a single spreading plate.

8. A device as described in claim 1, wherein the heat-generating device is a processing system and the device is a computing device.

9. A device as described in claim 1, wherein the plurality of enclosed heat pipes are arranged such that an effect of gravity on one of the heat pipes to perform heat transfer is counteracted by another one of the heat pipes.

10. A heat transfer device comprising:
   a thermal storage enclosure disposed proximal to a heat-generating device and configured to transfer heat from the heat-generating device using thermal conductivity and an amount of phase change material included within the thermal storage enclosure, the heat-generating device operates in a low power state configured to lessen resources utilized by the heat-generating device or a high power state configured to increase resources utilized by the heat-generating device, the phase change material configured to melt at a temperature above a first temperature achieved by the heat-generating device during the low power state and below a second temperature achieved by the heat-generating device during the high power state; and
   first and second enclosed heat pipes configured to transfer heat using thermal conductivity and phase transition from the thermal storage enclosure, the first and second enclosed heat pipes arranged to transfer heat from the heat-generating device towards opposing sides of a computing device, each of the first and second heat pipes having an evaporator portion and a condenser portion, the condenser portions of the first and second heat pipes are positioned further from each other than the evaporator portions of the first and second heat pipes, each of the first and second heat pipes including the same phase change material within the thermal storage enclosure or a different phase change material configured to undergo a different phase transition than the phase transition of the phase change material within the thermal storage enclosure.

11. A heat transfer device as described in claim 10, wherein the first and second enclosed heat pipes are oriented in the opposing directions away from the heat-generating device such that performance of the heat transfer device to transfer heat from the heat-generating device remains uniform during movement of a device that incorporates the heat transfer device and the heat-generating device.

12. A heat transfer device as described in claim 11, wherein the device includes a housing that is configured to be held by one or more hands of a user, the housing including the heat transfer device and the heat-generating device.

13. A heat transfer device as described in claim 11, wherein the heat-generating device is a processing system of a computing device that includes the heat transfer device.

14. A computing device comprising:
   a housing configured in a handheld form factor that is sized to be held by one or more hands of a user;
   a processing system disposed within the housing;
   a heat transfer device disposed proximal to the processing system in the housing and configured to transfer heat in opposing directions away from the processing system and comprising:
      a thermal storage enclosure configured to transfer heat from the processing system using thermal conductivity and an amount of phase change material included within the thermal storage enclosure, the phase change material configured to undergo a phase transition at a temperature above a first temperature achieved by the processing system operating at a low power state and below a second temperature achieved by the processing system operating at a high power state;
      a plurality of enclosed heat pipes including first and second heat pipes arranged in opposing directions, each of the first and second heat pipes having an evaporator portion and a condenser portion, the condenser portions of the first and second heat pipes are positioned further from each other than the evaporator portions of the first and second heat pipes, each of the plurality of enclosed heat pipes including the same phase change material within the thermal storage enclosure or a different phase change material configured to undergo a different phase transition than the phase transition of the phase change material within the thermal storage enclosure; and
      a plurality of fans disposed within the housing, at least two of which positioned at the opposing directions of the heat transfer device, respectively, and configured to increase speed of the plurality of fans when the temperature that causes the phase change material to undergo the phase transition is exceeded.

15. A heat transfer device as described in claim 10, wherein the thermal storage enclosure includes an amount of the phase change material within the thermal storage enclosure, the amount of the phase change material effective to allow a portion of the phase change material to not undergo the phase transition when the heat-generating device is operating in the high power state for a threshold period of time.

16. A computing device as described in claim 14, wherein the housing is configured to support movement through a plurality of orientations involving at least two dimensions during usage and the heat transfer device is configured to provide uniform cooling of the processing system during the movement.

17. A computing device as described in claim 14, wherein the plurality of enclosed heat pipes and condenser portions of the heat pipes are positioned for cooling by respective said fans in the housing.

18. A computing device as described in claim 17, wherein evaporator portions of the heat pipes are positioned proximal to the processing system.

19. A computing device as described in claim 17, wherein the plurality of enclosed heat pipes are arranged such that an effect of gravity on one of the heat pipes to perform heat transfer is counteracted by another one of the heat pipes.

20. A computing device as described in claim 14, further comprising a display device incorporated within the housing to be viewable by a user, the display device having a longitudinal axis and the opposing directions of the heat transfer device being aligned along the longitudinal axis.

* * * * *